US011437402B2

(12) United States Patent
Noack

(10) Patent No.: US 11,437,402 B2
(45) Date of Patent: Sep. 6, 2022

(54) MEMORY CELL CIRCUIT, MEMORY CELL ARRANGEMENT, AND METHODS THEREOF

(71) Applicant: Ferroelectric Memory GmbH, Dresden (DE)

(72) Inventor: Marko Noack, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 0 days.

(21) Appl. No.: 17/224,185

(22) Filed: Apr. 7, 2021

(65) Prior Publication Data

US 2021/0327901 A1    Oct. 21, 2021

(30) Foreign Application Priority Data

Apr. 21, 2020  (DE) .................. 102020110807.9

(51) Int. Cl.
| | |
|---|---|
| H01L 27/11 | (2006.01) |
| G11C 11/22 | (2006.01) |
| H01L 27/11592 | (2017.01) |
| H01L 27/11509 | (2017.01) |
| H01L 27/1159 | (2017.01) |
| H01L 27/11507 | (2017.01) |

(52) U.S. Cl.
CPC ...... *H01L 27/11592* (2013.01); *G11C 11/221* (2013.01); *G11C 11/223* (2013.01); *G11C 11/2273* (2013.01); *G11C 11/2275* (2013.01); *G11C 11/2297* (2013.01); *H01L 27/1159* (2013.01); *H01L 27/11507* (2013.01); *H01L 27/11509* (2013.01)

(58) Field of Classification Search
None
See application file for complete search history.

(56) References Cited

U.S. PATENT DOCUMENTS

| | | | | |
|---|---|---|---|---|
| 5,060,191 A | * | 10/1991 | Nagasaki ................ | G11C 11/22 365/117 |
| 6,537,830 B1 | * | 3/2003 | Arita .................... | C23C 18/1283 257/411 |
| 2003/0098497 A1 | * | 5/2003 | Solayappan ............ | H01L 28/57 257/629 |

(Continued)

FOREIGN PATENT DOCUMENTS

| | | |
|---|---|---|
| DE | 10016996 C1 | 2/2002 |
| EP | 0669655 A2 | 8/1995 |

OTHER PUBLICATIONS

Office Action filed in corresponding German application; 8 pages.

*Primary Examiner* — Tan T. Nguyen
(74) *Attorney, Agent, or Firm* — Black, McCuskey, Souers & Arbaugh LPA

(57) ABSTRACT

A memory cell circuit is provided that may include: a memory cell, the memory cell including a ferroelectric structure; a first control terminal and a second control terminal connected to the memory cell, the first control terminal and the second control terminal being configured to allow an operation of the memory cell; and a first auxiliary terminal and a second auxiliary terminal connected to the memory cell, the first auxiliary terminal and the second auxiliary terminal being configured to provide an auxiliary voltage to the ferroelectric structure.

19 Claims, 12 Drawing Sheets

(56) References Cited

U.S. PATENT DOCUMENTS

| | | | |
|---|---|---|---|
| 2004/0113186 A1* | 6/2004 | Karasawa | H01L 21/02197 |
| | | | 257/295 |
| 2009/0097299 A1* | 4/2009 | Tanaka | G11C 11/22 |
| | | | 257/295 |
| 2010/0027313 A1* | 2/2010 | Rodriguez | G11C 8/10 |
| | | | 365/145 |
| 2014/0022836 A1* | 1/2014 | Kim | G11C 11/1675 |
| | | | 365/158 |

* cited by examiner

(12) United States Patent — US 11,437,402 B2

MEMORY CELL CIRCUIT, MEMORY CELL ARRANGEMENT, AND METHODS THEREOF

CROSS-REFERENCE TO RELATED APPLICATION

The application claims the benefit of German Patent Application No. 10 2020 110 807.9 filed Apr. 21, 2020, which is incorporated by reference herein in its entirety.

TECHNICAL FIELD

Various aspects relate to a memory cell circuit, a memory cell arrangement and methods thereof, e.g. a method for fabricating a memory cell circuit and a method for fabricating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
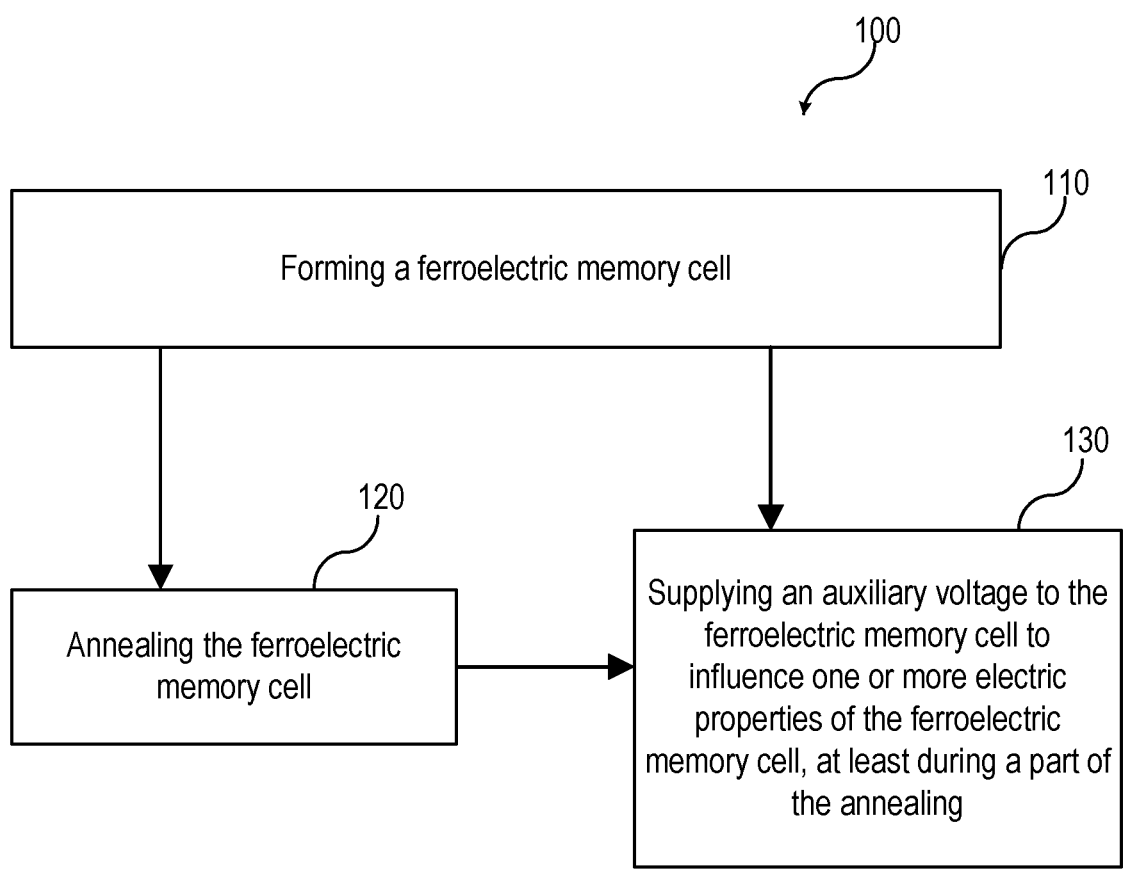
FIG. 1 shows a schematic flow diagram of a method for fabricating a memory cell circuit, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., circuits or arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "voltage" may be used herein with respect to "one or more control voltages", "one or more auxiliary voltages", "one or more auxiliary control voltages", "one or more gate voltages", "a base voltage", "one or more source/drain voltages", and the like. As an example, the term "control voltage" may be used herein to denote a voltage that is provided to a control node or a control terminal of a memory cell, as examples. Illustratively, a "control voltage" may be a voltage provided to or via a control-line of a memory cell circuit or arrangement, e.g. to or via a word-line, a source-line, a bit-line, a base-line, and the like. As another example, the term "auxiliary voltage" may be used herein to denote a voltage that is provided to an auxiliary node or an auxiliary terminal of a memory cell circuit or of a memory cell, as examples. The auxiliary voltage may be different from the control voltage, e.g. with respect to the amplitude, to the sign, to the timing of application (e.g., in case the auxiliary voltage is applied, the control voltage is not applied, and vice versa), and the like. As a further example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electrical circuit. As another example, the term "source/drain voltage" may be used herein to denote a voltage that is provided to a source/drain node or a source/drain terminal of a transistor or a memory cell, as examples.

A voltage provided to a terminal may be defined by the respective potential applied at that terminal relative to the base voltage (referred to as VB) of the circuit. Further, a voltage drop associated with two distinct nodes (or terminals) of a circuit may be defined by the respective voltages/potentials applied at the two nodes. As an example, a gate-source voltage drop associated with a gate structure (e.g. of a transistor or a memory cell) may be defined by the respective voltages/potentials applied at the corresponding gate node and source node of the gate structure.

According to various aspects, a memory cell may have at least two distinct states associated therewith, for example with two distinct electrical conductivities or two distinct amounts of stored charge that may be determined to determine in which of the at least two distinct states the memory cell is residing in. According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". According to various aspects, writing a memory cell may include erasing a memory cell (e.g., performing an erasing operation of a memory cell), wherein the memory state the memory cell is residing in after the erasing may be called "erased state". As an example, the programmed state may be an electrically conducting state or a state with positive stored charge (e.g. associated with a logic "1") and the erased state may be an electrically non-conducting state or a state with negative stored charge (e.g., associated with a logic "0"). However, the definition of programmed state and erased state may be selected arbitrarily.

The term "terminal" may be used herein to describe a location (e.g., a point) or structure of a device or of an element of the device to which electrical power may be applied and/or to which another device or element may be connected. Illustratively, a terminal may be a location or a structure that is electrically conductively connected with the device or the element (e.g., a memory cell, a decoupling structure, and the like). A terminal may be, for example, a node of a device or of an element. As another example, a terminal may be a line (e.g., a metal line) connected with the device or the element, e.g. a terminal may be a truncated metal line (e.g., an end point of the truncated metal line) connected with the device or the element.

In the semiconductor industry, the integration of non-volatile memory technologies may be useful for System-on-Chip (SoC) products like microcontrollers (MCU), etc.

According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor (FET) structure having a ferroelectric material as a gate insulator. As another example, a memory cell may include a field-effect transistor structure and a ferroelectric capacitor structure (FeCAP) coupled to a gate electrode of the field-effect transistor structure to provide a ferroelectric field-effect transistor (FeFET) structure. As a further example, a memory cell may include a ferroelectric capacitor structure (FeCAP) without a transistor associated thereto. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. Alternatively, a ferroelectric material may turn a ferroelectric capacitor structure into a non-volatile capacitor based memory structure, e.g. by controlling the amount of charge stored in the capacitor structure.

In some aspects, a memory cell circuit (e.g., including one memory cell) or a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective terminals of a memory cell (e.g., of each memory cell) to allow for the desired operation. The electrical lines may be referred to, for example, as word-lines, source-lines, and/or bit-lines. One approach to program and/or erase a plurality of memory cells may be a "one-third (⅓) voltage scheme". Such a ⅓ voltage scheme may realize that one-third of a programming voltage (the programming voltage may be also referred to as write voltage) is only substantially exceeded at terminals corresponding to one or more memory cells that are intended to be programmed or erased. All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

According to various aspects, a ferroelectric material may be used as part of a memory cell. Illustratively, ferroelectric materials may be used to store data in non-volatile manner in integrated circuits. The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

Various aspects may be related to a ferroelectric structure (e.g., layer) as memory structure or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

The term "predefined" may be used herein in relation to a condition or to one or more properties, e.g. of a memory cell or a ferroelectric structure, to include, for example, a desired condition or a desired value for a particular property. As an example, a predefined condition of a memory cell may be a condition in which the memory cell may provide better performances (e.g., in terms of failures associated with the operation of the memory cell) with respect to a non-predefined condition of the memory cell. Illustratively, an operation of a memory cell or of the memory cells of a memory cell arrangement may be designed based on assumed predefined conditions for the memory cell(s). As another example, a memory cell having a predefined property or a predefined value of a particular property (e.g., a predefined memory window, a predefined programming voltage, or the like) may provide better performances with respect to a memory cell having a non-predefined property or a non-predefined value of a particular property. It is understood that a memory cell, for example, may have more than one predefined condition. For example, a memory cell may have more than one conditions that ensure in a same or similar manner better performances with respect to other non-predefined conditions.

A manufacturing process of a memory cell (e.g., of a ferroelectric memory cell) may suffer from a low reproducibility of the properties that the memory cell has at the end of the process (e.g., the process may suffer from a deviation of the properties of the memory cell from predefined or desired properties that the memory cell should have). As an example, in case of a memory cell including a ferroelectric structure, the (e.g., electric) dipoles of the ferroelectric structure may assume a random orientation during the manufacturing process (e.g., dipoles in different grains or in different ferroelectric domains may be aligned in different directions). Illustratively, a ferroelectric material (e.g., hafnium oxide, or another material) may become crystalline during an annealing process, and dipoles may be created during crystallization. During the formation (e.g., during the crystallization) of the ferroelectric structure, there may not be a preferred orientation or alignment for the dipoles of the structure. The random orientation of the dipoles may lead to a large statistical variation of the properties of the ferroelectric structure, e.g. to a variation of the properties of the memory cell including the structure. By way of example, different memory cells may have different programming voltages, which may lead to a higher stress during a programming operation of a memory cell arrangement including the memory cells. As another example, different memory cells may have different memory windows, which may lead to overlap of the memory states of the memory cells (e.g., to same or similar readout voltages being associated with different memory states).

Various aspects are related to a fabrication method for providing a (e.g., ferroelectric) memory cell having predefined properties (e.g., having properties substantially corresponding to predefined properties). Illustratively, various aspects are related to a fabrication method adapted to increase the reproducibility of the properties associated with a memory cell, e.g. a fabrication method adapted to control the properties of a memory structure of the memory cell during fabrication (e.g., during an annealing of the memory cell and/or during an annealing of the memory structure).

According to various aspects, a method for fabricating a memory cell circuit may include forming a ferroelectric memory cell (e.g., FeFET based or FeCAP based); annealing the ferroelectric memory cell; and at least during a part of the annealing, supplying an auxiliary voltage to the ferroelectric memory cell to influence one or more electric properties of the ferroelectric memory cell.

In some aspects, by applying an electrical field to a material during crystallization the dipoles may be oriented in a defined way. In some aspects, energy harvesting in form of photovoltaic may be used to apply an electrical field to a ferroelectric material (e.g., hafnium oxide) during crystallization. This may provide a defined alignment of the dipoles of the material.

The method is described herein in relation to a ferroelectric memory cell and to a ferroelectric memory structure, as an example. It is understood that the method may be applied for any type of memory cell or memory structure whose electric properties and/or structural may be influenced or controlled by an applied auxiliary voltage (e.g., by an applied electric field) during fabrication.

The annealing of the memory cell may be understood, in general, as a process to induce a phase change (e.g., a crystallization) of an amorphous ferroelectric material of the memory cell. Illustratively, a crystallization of the amorphous material is induced (e.g., by means of annealing), such that the material reaches a ferroelectric phase (in other words, a ferroelectric state). The auxiliary voltage may be supplied during the crystallization of the amorphous material, e.g. at least during a part of the process in which the amorphous material transitions into a crystalline structure (e.g., into an orthorhombic structure). The auxiliary voltage may influence the crystalline structure, e.g. the size and orientation of the grains and/or of the ferroelectric domains of the structure.

In some aspects, the annealing may be carried out after forming (e.g., connecting) a conductive layer (e.g., a metal layer) on the ferroelectric material (illustratively, on top of the already deposited ferroelectric material).

In some aspects, during the annealing the memory cell (e.g., a FeCAP memory cell) is not connected from the external, e.g. is not connected to any external device or circuit).

According to various aspects, a method for fabricating a memory cell circuit may include forming a ferroelectric structure (e.g., of a memory cell, for example a ferroelectric layer or film); annealing the ferroelectric structure; and at least during a part of the annealing, supplying an auxiliary voltage to the ferroelectric structure to influence one or more electric properties of the ferroelectric structure. Illustratively, the method may include inducing a crystallization of the ferroelectric structure, and at least during a part of the crystallization, supplying an auxiliary voltage to the ferroelectric structure to bring the ferroelectric structure into a predefined condition (e.g., into a condition in which the dipoles and/or the ferroelectric domains of the ferroelectric structure are oriented into a predefined direction).

Forming a ferroelectric structure may be understood as forming a structure including a material that exhibits ferroelectric properties in at least one state or in at least one phase. As an example, forming a ferroelectric structure may include depositing an amorphous material that may exhibit ferroelectric properties in at least one state (e.g., in a crystalline state).

According to various aspects, a method for fabricating a memory cell circuit may include forming a ferroelectric structure; annealing the ferroelectric structure; and at least during a part of the annealing, controlling an orientation of the dipoles of the ferroelectric structure (e.g., of the material of the ferroelectric structure), e.g. to orient the dipoles along a predefined or preferred direction. Illustratively, the method may include inducing a crystallization of the ferroelectric structure, and at least during a part of the crystallization, applying an electric field across (in other words, over) the ferroelectric structure to orient the dipoles (and/or the ferroelectric domains) of the ferroelectric structure in the direction of the applied electric field.

Various aspects are related to a memory cell circuit adapted such that during the fabrication of the memory cell circuit one or more predefined properties of the memory cell circuit (e.g., of a memory cell of the memory cell circuit and/or of a ferroelectric structure of the memory cell) may be provided. Illustratively, the memory cell circuit may be configured such that an auxiliary voltage may be provided to the memory cell (e.g., to the ferroelectric structure of the memory cell), e.g. during at least a part of the fabrication.

According to various aspects, a memory cell circuit may include a memory cell, the memory cell including a ferroelectric structure; a first control terminal and a second control terminal connected to the memory cell, the first control terminal and the second control terminal being configured to allow an operation of the memory cell; a first auxiliary terminal and a second auxiliary terminal connected to the memory cell, the first auxiliary terminal and the second auxiliary terminal being configured to provide (e.g., to deliver) an auxiliary voltage to the ferroelectric structure.

In some aspects, a memory cell circuit may include a single memory cell, with the first control terminal, the second control terminal, the first auxiliary terminal, and the second auxiliary terminal connected to the memory cell. Illustratively, the memory cell circuit may include a one-to-one relationship between the auxiliary terminals and the memory cell. In some aspects, a memory cell circuit may include a plurality of memory cells, e.g. a logic structure formed by a plurality of memory cells, such as a NAND structure or a NOR structure, as examples. The plurality of memory cells may be arranged in a string, and the memory cells may be connected with one another (e.g., in series or in parallel) to form the logic structure. In this configuration, the first control terminal, the second control terminal, the first auxiliary terminal, and the second auxiliary terminal may be connected to the string of memory cells, e.g. the first control terminal and the first auxiliary control terminal may be connected to the first memory cell of the string, and the second control terminal and the second auxiliary control terminal may be connected to the last memory cell of the string.

An auxiliary terminal may be a terminal which is not connected or is not configured to be connected to any addressing circuit or control circuit, e.g. to any circuit configured or used to address or operate the memory cell. In some aspects, an auxiliary terminal may be a terminal which is not connected or is not configured to be connected to any test circuit for testing the operation of a memory cell (e.g., during or after the fabrication). Illustratively, an auxiliary terminal may not be used to perform (or to test) a reading operation or a writing operation of the memory cell. A control terminal may be a terminal which is connected or is configured to be connected to an addressing circuit or control circuit, e.g. to a circuit configured or used to operate the memory cell, as described in further detail below. In various aspects, an auxiliary terminal may be connected to a same node as a control terminal (e.g., to a same contact element of a memory cell, for example to a same electrode), e.g. an auxiliary terminal may be considered as an additional portion (e.g., an extension) of a control terminal. Illustratively, an auxiliary terminal may be a branch of a control terminal, e.g. an auxiliary terminal may branch off from a control terminal. The auxiliary terminal and the associated control terminal may be at a same potential during operation of the memory cell (e.g., at a potential provided to the control terminal, for example by a control circuit) and during fabrication of the memory cell (e.g., at a potential provided to the auxiliary terminal, for example by an auxiliary voltage supply circuit).

In the following, a memory cell circuit including two control terminals (e.g., a first control terminal and a second control terminal) is illustrated and described. It is however understood that a memory cell circuit may include more than two control terminals (e.g., three control terminals, four control terminals, or more than four control terminals). As an example a memory cell circuit may include two control terminals associated with a reading operation and two control terminals associated with a writing operation. In some aspects, at least one control terminal of a memory cell circuit (e.g., of each memory cell circuit of a memory cell arrangement) may be connected to a base voltage, e.g. to a common potential (such as a ground potential, or any other potential).

In the following, a memory cell circuit including two auxiliary terminals (e.g., a first auxiliary terminal and a second auxiliary terminal) is illustrated and described. However, in some aspects, one of the at least two control terminals may serve as auxiliary terminal. Illustratively, the memory cell circuit may include at least one auxiliary terminal, and one of the at least two control terminals may serve as first auxiliary terminal or second auxiliary terminal, e.g. during fabrication of the memory cell circuit. By way of example, a control terminal connected to a common potential (e.g., to ground) may serve as auxiliary terminal during fabrication of the memory cell circuit and as control terminal during operation of the memory cell circuit.

According to various aspects, a memory cell circuit may include a memory cell, the memory cell including a ferroelectric structure; two or more control terminals connected to the memory cell, the two or more control terminals being configured to allow an operation of the memory cell; a first auxiliary terminal configured to provide (e.g., to deliver) a first auxiliary voltage to the memory cell, and a second auxiliary terminal configured to provide a second auxiliary voltage to the memory cell (e.g., a first auxiliary terminal and a second auxiliary terminal configured to provide a voltage drop between the first auxiliary terminal and the second auxiliary terminal, e.g. a voltage drop across the ferroelectric structure of the memory cell).

According to various aspects, a memory cell arrangement may include a plurality of memory cell circuits. Each memory cell circuit may include: a memory cell including a ferroelectric structure; at least two control terminals connected to the memory cell, the at least two control terminals being configured to allow an operation of the memory cell; at least one auxiliary terminal (e.g., a first auxiliary terminal and a second auxiliary terminal) connected to the memory cell, the at least one auxiliary terminal being configured to provide an auxiliary voltage to the ferroelectric structure. The memory cell arrangement may further include an auxiliary voltage supply circuit coupled to each memory cell circuit of the plurality of memory cell circuits, the auxiliary voltage supply circuit being configured to generate the respective auxiliary voltage for each memory cell circuit of the plurality of memory cell circuits.

According to various aspects, a method of fabricating a memory cell arrangement may include forming a plurality of ferroelectric memory cells; annealing (e.g., simultaneously) the ferroelectric memory cells; and at least during a part of the annealing, supplying an auxiliary voltage to at least one (e.g., to each) ferroelectric memory cell to influence one or more electric properties of the at least one ferroelectric memory cell (e.g., to orient the dipoles of the ferroelectric structure of the at least one memory cell along a predefined direction).

In some aspects, the auxiliary voltage supply circuit may be configured to provide an auxiliary voltage to other devices, e.g. in addition or in alternative to the memory cells. As an example, the auxiliary voltage supply circuit may be configured to provide an auxiliary voltage to one or more circuits on a wafer, e.g. during fabrication of the one or more circuits.

FIG. 1 shows a schematic flow diagram of a method 100 for fabricating a memory cell circuit, according to various aspects. The method 100 may include, in 110, forming a ferroelectric memory cell (e.g., forming a memory cell including a ferroelectric structure, e.g. a memory cell including a memory structure including a ferroelectric material). The ferroelectric memory cell may include, for example, a capacitor structure and/or a field-effect transistor structure, as described in further detail below. Forming a ferroelectric memory cell may be understood as fabricating the components that provide data storing functionalities (e.g., a capacitor and/or a transistor, one or more terminals, and the like), for example using complementary metal-oxide-semiconductor technology. By way of example, forming a ferroelectric memory cell may include forming (e.g., depositing or growing) a ferroelectric structure (e.g., depositing or growing a material, e.g. an amorphous material, that exhibits ferroelectric properties in at least one state).

The method 100 may include, in 120, annealing the ferroelectric memory cell. Annealing the ferroelectric memory cell may include annealing the ferroelectric structure, e.g. annealing the amorphous material to bring the material in a state in which it exhibits ferroelectric properties. In various embodiments, the ferroelectric structure (e.g., the amorphous material) may include hafnium oxide. The material of the ferroelectric structure may be doped, e.g., at a concentration from about 2 mol % to about 6 mol %, only as a numerical example. As a non-limiting example, the doping material may be silicon. Annealing the ferroelectric memory cell may be understood as performing an operation on the memory cell to induce a phase change in a material forming a memory structure of the memory cell, e.g. to induce a crystallization in the material of the ferroelectric structure.

In various aspects, annealing the ferroelectric memory cell (e.g., annealing the ferroelectric structure) may include heating the ferroelectric memory cell to a temperature that induces a phase change (e.g., a crystallization) in the material of a ferroelectric structure of the memory cell. By way of example, annealing the ferroelectric memory cell may include heating the ferroelectric memory cell to a temperature (e.g., an annealing temperature) configured (e.g., selected) to induce a phase change in the material of the ferroelectric structure.

It is understood that the annealing temperature may be adapted according to the properties of the material of the ferroelectric structure (e.g., the type of material, or the doping).

The annealing may include different types of annealing processes, e.g. may be carried out with different types of annealing devices configured to provide a temperature (e.g., a heating profile) that induces a phase change in the material of the ferroelectric structure. By way of example, the annealing may be or may include a rapid thermal anneal process. In various aspects, the annealing may take place under strong illumination (e.g., by means of halogen lamps), e.g. the annealing may be or may include a flash lamp annealing.

In various aspects, annealing the ferroelectric memory cell may include irradiating the ferroelectric memory cell with annealing radiation (e.g., with radiation configured to heat the ferroelectric memory cell to the desired annealing temperature). In some aspects, the annealing radiation may include electromagnetic radiation or waves. By way of example, the annealing radiation may include light (e.g., generated by one or more halogen lamps), e.g. having a wavelength in the range from about 100 nm to about 1500 nm, for example in the range from about 500 nm to about 1000 nm. In some aspects, the light may be halogen light having a strong spectrum.

The method 100 may include, in 130, supplying an auxiliary voltage to the ferroelectric memory cell to influence one or more electric properties of the ferroelectric memory cell at least during part of the annealing. In some aspects, the auxiliary voltage may influence one or more electric properties (and/or one or more structural properties) of the ferroelectric structure.

In some aspects, supplying an auxiliary voltage to the ferroelectric memory cell may include supplying an auxiliary voltage to the ferroelectric structure of the memory cell. Illustratively, supplying an auxiliary voltage to the ferroelectric memory cell may include providing a voltage drop across the ferroelectric structure (e.g., providing an electric field across the ferroelectric structure, for example in the direction of a thickness of the ferroelectric structure).

In some aspects, supplying an auxiliary voltage to the ferroelectric memory cell at least during part of the annealing may be understood as supplying an auxiliary voltage at least during part of a transition of the material of the ferroelectric structure from an amorphous state to a state exhibiting ferroelectric properties, e.g. at least during part of a crystallization of the material of the ferroelectric structure.

The one or more electric properties of the ferroelectric memory cell may be influenced by the effect(s) that the supplied auxiliary voltage has on the ferroelectric structure of the memory cell (e.g., on one or more electric properties and/or structural properties of the ferroelectric structure), as described in further detail below.

In various aspects, the supplied auxiliary voltage may reorient the electric dipoles of the ferroelectric structure of the memory cell, e.g. along a predefined direction. Illustratively, the supplied auxiliary voltage may influence the ferroelectric structure such that its electric dipoles align under the influence of the supplied auxiliary voltage (e.g., under the influence of the voltage drop across the ferroelectric structure). The electric dipoles of the ferroelectric structure would normally be randomly oriented after the crystallization of the material of the ferroelectric structure. The supplied auxiliary voltage (e.g., the electric field formed across the ferroelectric structure during at least part of the annealing) provides a preferential direction for the orientation of the electric dipoles, e.g. the direction of the electric field across the ferroelectric structure. In various aspects, the supplied auxiliary voltage may influence the formation of grains and/or ferroelectric domains in the ferroelectric structure during its crystallization. Illustratively, the supplied auxiliary voltage may align the grains and/or ferroelectric domains of the ferroelectric structure in the predefined direction.

The alignment of the dipoles of the ferroelectric structure along a predefined direction may define predefined electric properties for the ferroelectric structure. This may reduce or substantially eliminate statistical variations between the actual electric properties of a memory cell and the predefined electric properties of the memory cell. Illustratively, this may provide that different memory cells (e.g., in a same memory cell arrangement, or in different memory cell arrangements) have substantially the same one or more predefined electric properties (e.g., that the respective ferroelectric structures have substantially the same one or more predefined electric properties).

In various aspects, the supplied auxiliary voltage may be configured to bring the ferroelectric memory cell into a predefined condition, e.g. into a condition in which the memory cell has one or more predefined electric properties. Illustratively, the supplied auxiliary voltage may influence the one or more electric properties of the ferroelectric memory cell such that after the auxiliary voltage has been supplied the memory cell has one or more predefined electric properties (e.g., one or more electric properties substantially equal to one or more predefined electric properties). In some aspects, the supplied auxiliary voltage may be configured to bring the ferroelectric structure of the memory cell into a predefined condition.

In some aspects, the one or more electric properties of the memory cell may include a remanent polarization of the ferroelectric structure of the memory cell. In some aspects, the predefined condition of the memory cell may include a predefined remanent polarization of the ferroelectric structure. By way of example, the one or more predefined electric properties of the memory cell may include a remanent polarization of the ferroelectric structure having a predefined absolute value (e.g., a predefined maximum achievable absolute value), and/or a predefined sign. In some aspects, the alignment of the dipoles into a preferred direction provides a remanent (e.g., positive or negative) polarization of the ferroelectric structure after fabrication having an absolute value in a predefined range, e.g., in a range from about 90% of a predefined absolute value to about 110% of the predefined absolute value.

In some aspects, the one or more electric properties of the memory cell may include a coercive field of the ferroelectric structure of the memory cell. In some aspects, the predefined condition of the memory cell may include a predefined coercive field of the ferroelectric structure of the memory cell. By way of example, the one or more predefined electric properties of the ferroelectric memory cell may include a coercive field of the ferroelectric structure having a predefined absolute value (e.g., a positive coercive field having a first predefined absolute value, and a negative coercive field having a predefined second absolute value). In some aspects, the coercive field of the ferroelectric structure may have a value in a range from about 90% of a predefined absolute value of the coercive field to about 110% of the predefined absolute value of the coercive field. As an example, the one or more predefined electric properties may include a positive coercive field value and a negative coercive field value such that a hysteresis curve associated with the ferroelectric structure is centered in a plot of the polarization, P, versus electric field, E.

In some aspects, the one or more electric properties of the ferroelectric memory cell may include a memory window of the memory cell, illustratively a range of voltages which may be provided to the memory cell to determine its memory state. The supplied auxiliary voltage may determine a width of the memory window, and/or a position of the memory window in the QV diagram of the memory cell. In some aspects, the predefined condition of the memory cell may include a predefined memory window of the memory cell (e.g., a memory window having a predefined width or a predefined position in the QV diagram).

In some aspects, the one or more electric properties of the ferroelectric memory cell may include a programming voltage and/or a readout voltage of the memory cell. In some aspects, the predefined condition of the memory cell may include a predefined programming voltage and/or a predefined readout voltage (e.g., a programming voltage having a predefined voltage value, e.g. 2 V, and a readout voltage having a predefined voltage value, e.g. 1 V). By way of example, the supplied auxiliary voltage may be configured such that the ferroelectric memory cell has a programming voltage and/or a readout voltage having a value in a range from about 90% to about 110% of predefined value for the programming voltage and/or the readout voltage, respectively.

In some aspects, in case the memory cell includes or is configured as a field-effect transistor, the one or more electric properties of the memory cell may include one or more threshold voltages of the memory cell (e.g., a first threshold voltage, $V_{L-th}$, and a second threshold voltage, $V_{H-th}$), for example associated with one or more memory states of the memory cell. The supplied auxiliary voltage may determine (e.g., define) an absolute value of the one or more threshold voltages, e.g. a position of the one or more threshold voltages in a QV diagram of the memory cell. In some aspects, the predefined condition of the memory cell may include a predefined voltage value for the first and/or second threshold voltage. By way of example, the supplied auxiliary voltage may be configured such that the ferroelectric memory cell has first and/or second threshold voltage having a value in a range from about 90% to about 110% of predefined value for the first and/or second threshold voltage, respectively.

In various aspects, the supplied auxiliary voltage may have a voltage value configured (e.g., selected) to influence the properties of the memory cell, e.g. a value sufficient to reorient the crystallites of the ferroelectric structure permanently. By way of example, the supplied auxiliary voltage (e.g., the voltage drop across the memory cell) may have a voltage value greater than about 100 mV, for example greater than about 1 V. As another example, the supplied auxiliary voltage may have a voltage value in the range from about 500 mV to about 20 V. It is understood that the voltage value of the supplied auxiliary voltage may be adjusted depending on the properties of the memory cell, e.g. on the properties of the ferroelectric structure (e.g., material, thickness, doping, and the like). Illustratively, the configuration of a circuit used to generate the auxiliary voltage may be adjusted depending on the type or the properties of the memory cell, as described in further detail below.

In various aspects, supplying an auxiliary voltage to the ferroelectric memory cell may include converting annealing radiation into electrical power (e.g., into a current or a voltage), e.g. converting electromagnetic radiation (e.g., waves) into an electrical power, and providing the electrical power to the ferroelectric memory cell. The auxiliary voltage may be generated by means of one or more elements configured to receive electromagnetic radiation and convert the received electromagnetic radiation into electrical power, as described in further detail below. By way of example, the conversion of electromagnetic radiation into electrical power may be carried out by means of one or more photo diodes, one or more antennas (e.g., one or more rectifying antennas), one or more coils, and the like.

The electromagnetic radiation may be provided to generate the auxiliary voltage, e.g. may be dedicated to generating the auxiliary voltage. In some aspects, the electromagnetic radiation may be used in an annealing process and may serve—at the same time—for generating the auxiliary voltage. Illustratively, the annealing radiation may be or may include electromagnetic radiation, a part of which is converted into electrical power (e.g., light converted by means of one or more photo diodes). The method 100 may include irradiating the ferroelectric memory cell with annealing radiation, wherein at least part of the annealing radiation anneals the ferroelectric memory cell and at least another part of the annealing radiation is converted into electrical power to supply the auxiliary voltage to the ferroelectric memory cell.

The configuration of a memory cell circuit adapted such that an auxiliary voltage may be provided to a memory cell included in the memory cell circuit (e.g., during fabrication) will now be described in relation to FIG. 2A to FIG. 2E.

Figure 2A:
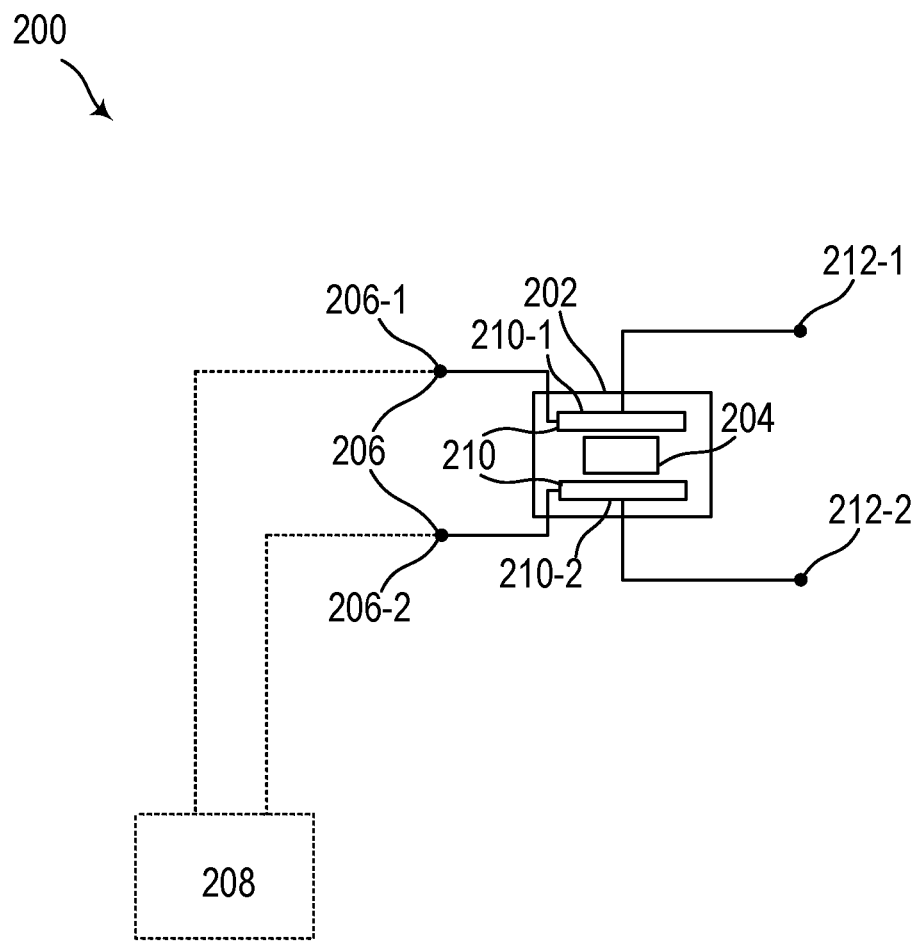
FIG. 2A, shows schematically a memory cell circuit, according to various aspects.

FIG. 2A illustrates schematically an exemplary configuration of a memory cell circuit 200, according to various aspects. The memory cell circuit 200 may include a memory cell 202. The memory cell 202 may include a ferroelectric structure 204, e.g. a memory structure including a ferroelectric material. In some aspects, the memory cell circuit 200 may include a plurality of memory cells 202, e.g. a string of memory cells 202.

In various aspects, the ferroelectric structure 204 may include a ferroelectric layer or may be a ferroelectric layer (e.g., having a thickness of about 5 nm, for example of about 10 nm, for example of about 50 nm). Illustratively, the memory cell 202 may be a ferroelectric memory cell (e.g., including a capacitor structure and/or a field-effect transistor structure, as will be described in relation to FIG. 3A and FIG. 3B). The memory cell 202 may also include a plurality of ferroelectric structures 204 (e.g., a plurality of ferroelectric layers), for example stacked one above the other. It is understood that the ferroelectric structure 204 may be or may include any type of structure configured (e.g., arranged) to provide data storing capabilities by means of the ferroelectric properties of the structure (e.g., of the material of the structure). In various aspects, the ferroelectric structure 204 may include a ferroelectric material, for example hafnium oxide (e.g., ferroelectric $HfO_2$). The ferroelectric material may be doped (e.g., at a concentration from about 2 mol % to about 6 mol %), for example with silicon, only as an example.

In various aspects, the ferroelectric structure 204 may be a structure capable of retaining a remanent-polarization in absence of an applied electric field. The memory state the memory cell 202 is residing in may be associated with one of at least two polarization states of the ferroelectric structure 204, as described in further detail below, for example in relation to FIG. 3A and FIG. 3B. Illustratively, the memory cell 202 may be configured to allow for a persistent change of the memory state the memory cell 202 is residing in as a function of the state of the ferroelectric structure 204. Accordingly, the memory cell 202 may have at least a first memory state and a second memory state defined by the state of the ferroelectric structure 204.

In various aspects, the memory cell circuit 200 may include at least two control terminals 206 connected to the memory cell 202 (e.g., a first control terminal 206-1 and a second control terminal 206-2). The at least two control terminals 206 (e.g., the first control terminal 206-1 and the second control terminal 206-2) may be configured to allow an operation of the memory cell 202. Illustratively, the at least two control terminals 206 may be configured to provide control voltages to the memory cell 202 (e.g., to respective nodes or electrodes of the memory cell 202) to allow an operation of the memory cell 202. The at least two terminals 206 may be configured to allow any type of addressing of the memory cell 202. By way of example, a first control terminal 206-1 may be configured to receive a first voltage from a first control-line (e.g., a word-line) of a memory cell arrangement including the memory cell circuit 200, and a second control terminal 206-2 may be configured to receive a second voltage from a second control line (e.g., a source-line or a bit-line) of the memory cell arrangement. In some aspects, the at least two terminals 206 may be configured to allow any type of addressing of the string of memory cells 202, e.g. to allow an operation of the string of memory cells 202 (a simultaneous write or erase operation of the memory cells 202 of the string). In this configuration, a voltage provided to a memory cell 202 may be understood as a voltage provided to each memory cell 202 of the string, and a voltage drop across a memory cell 202 may be understood as a voltage drop across each memory cell 202 of the string.

The operation of the memory cell 202 may include any type of memory related operation. By way of example, allowing an operation of the memory cell 202 may include allowing a reading of the memory cell 202 or allowing a writing of the memory cell 202. The at least two control terminals 206 may be configured such that one or more reading voltages (e.g., one or more readout voltages) and/or one or more writing voltages may be provided to the memory cell 202. Writing the memory cell 202 may include programming the memory cell 202 (e.g., providing voltages to the memory cell 202 to set a logic "1" state of the memory cell 202, for example to bring the ferroelectric structure 204 in a first polarization state) or erasing the memory cell 202 (e.g., providing voltages to the memory cell 202 to set a logic "0" state of the memory cell 202, for example to bring the ferroelectric structure 204 in a second polarization state).

Allowing an operation of the memory cell may be understood, in some aspects, as applying at least two control voltages at the at least two control terminals 206. Due to the configuration of the memory cell circuit 200, an operation voltage drop (e.g., a write voltage, a read voltage, etc.) is provided across the ferroelectric structure 204, wherein the operation voltage drop is defined by the control voltages applied at the at least two control terminals 206.

According to various aspects, the memory cell circuit 200 may optionally include or may be coupled with a control circuit 208 (e.g., the control circuit 208 may be part of the memory cell circuit 200, or may be part of a memory cell arrangement including the memory cell circuit 200, as described in further detail below). The control circuit 208 may also be referred to as addressing circuit or operation circuit. The control circuit 208 may be configured to carry out and/or instruct one or more operations (e.g., one or more readout operations and/or one or more write operations) of the memory cell 202. The control circuit 208 may be configured to supply one or more readout signals and/or one or more write signals to the memory cell 202 (e.g., to the at least two control terminals 206 of the memory cell 202). Illustratively, the control circuit 208 may be connected to the at least two control terminals 206 and the control circuit 208 may be configured to operate the memory cell 202. As an example, the control circuit 208 may include or may control one or more voltage supply circuits. The one or more voltage supply circuits may be used for supplying control voltages (e.g. readout voltages and write voltages) to the control terminals 206 of the memory cell 202 (e.g., to control-lines of a memory cell arrangement including the memory cell circuit 200 coupled with the control terminals 206). According to various aspects, the control circuit 208 may define a base voltage, VB, e.g. a ground voltage (for example 0 V) associated with the memory cell circuit 200 (or associated with the memory cell arrangement). It is understood that any type of addressing device or circuit may be provided for addressing a memory cell 202, e.g. for controlling the memory cell 202.

In various aspects, the memory cell 202 may include at least two contact elements 210 (in other words, two or more contact elements 210, e.g. a first contact element 210-1 and a second contact element 210-2) configured to receive a voltage (e.g., a control voltage or an auxiliary voltage, as described in further detail below). The at least two contact elements 210 may be configured to receive control voltages to instruct an operation of the memory cell 202, e.g. a contact element (e.g., each contact element) may be connected to a respective control terminal 206. In some aspects, allowing an operation of the memory cell 202 may include providing a voltage drop between at least two contact elements 210, illustratively a voltage drop across the ferroelectric structure 204. By way of example, the at least two contact elements 210 may be or may include the conducting layers (e.g., the electrodes) of a FeCAP structure, or the nodes (e.g., the gate node and the source/drain nodes) of a FeFET structure, as described in relation to FIG. 3A and FIG. 3B, respectively.

The ferroelectric structure 204 may be arranged between at least two of the contact elements 210 (e.g., between a first contact element 210-1 and a second contact element 210-2). Illustratively, the ferroelectric structure 204 may be arranged with respect to the contact elements 210 in such a way that a voltage drop between at least two contact elements 210 (e.g., between the first contact element 210-1 and the second contact element 210-2) provides a voltage drop across the ferroelectric structure 204. Stated in a different fashion, the ferroelectric structure 204 may be arranged with respect to the contact elements 210 in such a way that providing (e.g., supplying) a respective voltage to at least two of the contact elements 210 provides a corresponding voltage drop across the ferroelectric structure 204.

In various aspects, the memory cell circuit 200 may include a first auxiliary terminal 212-1 and a second auxiliary terminal 212-2 connected to the memory cell 202. The first auxiliary terminal 212-1 and the second auxiliary terminal 212-2 may be configured to provide an auxiliary voltage to the ferroelectric structure 204. In some aspects, the first auxiliary terminal 212-1 and the second auxiliary terminal 212-2 may be configured to provide a voltage drop across the ferroelectric structure 204 (illustratively, an electric field across the ferroelectric structure 204).

In some aspects, an auxiliary terminal may be a structure (e.g., a line) electrically conductively connected to the memory cell 202, such that a voltage applied at the auxiliary terminal is provided (e.g., forwarded) to the memory cell 202 (e.g., such that a current or at least part of a current arriving at the auxiliary terminal is provided to the memory cell 202). By way of example, an auxiliary terminal may be connected to a respective contact element of the memory cell 202. Only as an example, the first auxiliary terminal 212-1 may be connected to the first contact element 210-1, and the second auxiliary terminal 212-2 may be connected to the second contact element 210-2. It is understood that the memory cell circuit 200 may include more than two auxiliary terminals (e.g., three, four, five, ten, or more than ten auxiliary terminals) to provide a plurality of voltage drops across the memory cell 202 (e.g., in case the memory cell 202 includes a plurality of ferroelectric structures 204). As described above, the memory cell circuit 200 may alternatively include one auxiliary terminal, and one of the control terminals may serve as auxiliary terminal, e.g. during fabrication of the memory cell circuit 200.

Providing an auxiliary voltage to the ferroelectric structure 204 may be understood, in some aspects, as applying a first auxiliary voltage at the first auxiliary terminal 212-1 and applying a second auxiliary voltage at the second auxiliary terminal 212-2. Due to the configuration of the memory cell circuit 200, an auxiliary voltage drop is provided across the ferroelectric structure 204, wherein the auxiliary voltage drop is defined by the first auxiliary voltage applied at the first auxiliary terminal 212-1 and the second auxiliary voltage applied at the second auxiliary terminal 212-2.

In various aspects, an auxiliary terminal is a terminal that may not be used to address the memory cell 202, e.g. a terminal that may not be used to control an operation of the memory cell 202. Illustratively, an auxiliary terminal is a terminal that is not connected and not configured to be connected to any type of addressing or control circuit (e.g., the control circuit 208). Further illustratively, an auxiliary terminal is a terminal dedicated to a function other than controlling an operation of the memory cell 202. In some aspects, a control terminal 206 (e.g., the first control terminal 206-1 and/or the second control terminal 206-2) may be understood as a terminal connected or intended to be connected to a control circuit and/or to one or more control lines (e.g., word-lines, source-lines, and/or bit-lines), whereas an auxiliary terminal (e.g., the first auxiliary terminal 212-1 and/or the second auxiliary terminal 212-2) may be understood as a terminal not connected and not intended to be connected to a control circuit and/or to any control line.

The auxiliary voltage provided to the ferroelectric structure 204 may be configured to influence one or more electrical (and/or structural) properties of the ferroelectric structure 204. The auxiliary voltage provided to the ferroelectric structure 204 may provide (e.g., induce) one or more predefined properties of the ferroelectric structure 204 and/or one or more predefined properties of the memory cell 202, as described above in relation to FIG. 1.

Figure 2B:
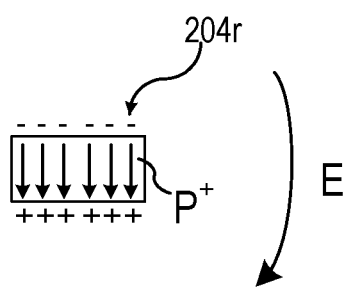
FIG. 2B and FIG. 2C each show schematically a polarization state of a ferroelectric structure, according to various aspects.
Figure 2C:
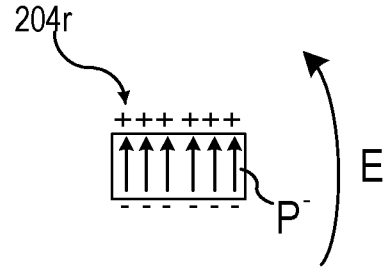

FIG. 2B and FIG. 2C show schematically a ferroelectric structure 204r in two exemplary orientation states of the dipoles of the structure. The ferroelectric structure 204r may be, for example, part of a memory cell (e.g., the ferroelectric structure 204r may be the ferroelectric structure 204 of the memory cell 202). The orientation states may be associated with a respective polarization state, defined by a residual polarization P⁺, P⁻ of the ferroelectric structure 204r.

As an example, in a first orientation state, the residual polarization, P+, within the ferroelectric structure 204r may be directed in a first direction (see FIG. 2B). The first orientation state may be referred herein to as positive polarization state. In a second orientation state, the residual polarization P⁻ within the ferroelectric structure 204r may be directed in a second direction (see FIG. 2C). The second orientation state may be referred herein to as negative polarization state. The second direction may be opposite with respect to the first direction (illustratively, rotated by substantially 180°). It is understood that the definition of positive polarization state and negative polarization state is arbitrary, and may depend on further properties or features of a memory cell including the ferroelectric structure 204r. The first direction and the second direction may be opposite to one another along a direction of the thickness of the ferroelectric structure 204r.

The first orientation state may be provided or induced by generating an electric field (e.g., a first electric field), E, across the ferroelectric structure 204r in the first direction (e.g., by a voltage drop across the ferroelectric structure 204r providing an electric field in the first direction), see FIG. 2B. The second orientation state may be provided by generating an electric field (e.g., a second electric field), E, across the ferroelectric structure 204r in the second direction (e.g., by a voltage drop across the ferroelectric structure 204r providing an electric field in the second direction), see FIG. 2C. Illustratively, the dipoles (and/or the ferroelectric domains) of the ferroelectric structure 204r may be oriented along the first direction by the first electric field, and the dipoles of the ferroelectric structure 204r may be oriented along the second direction by the second electric field. In some aspects, providing an electric field, E, into a predefined direction, e.g. during and/or after fabrication (e.g., during and/or after annealing), may provide an orientation of the dipoles (and/or the ferroelectric domains) of the ferroelectric structure 204r along that direction.

Figure 2D:
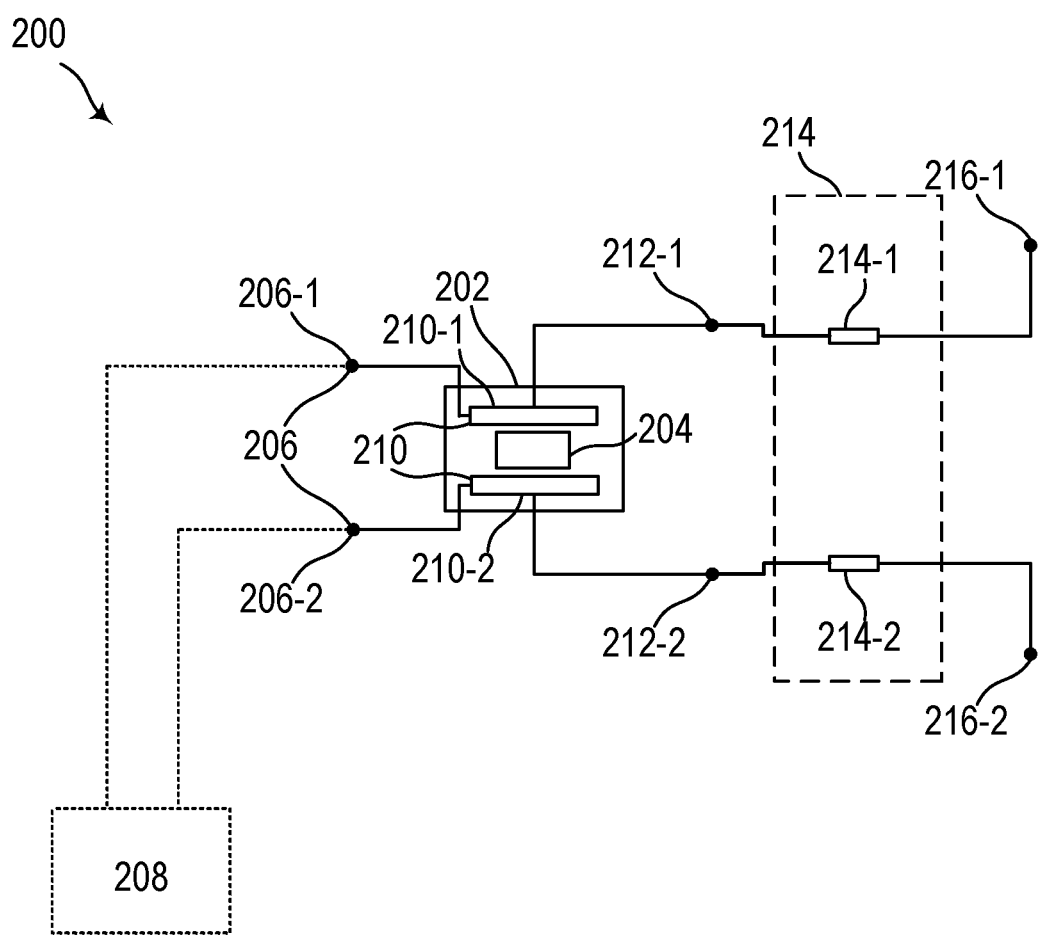
FIG. 2D and FIG. 2E each show schematically a memory cell circuit, according to various aspects.

In various aspects, a memory cell circuit (e.g., the memory cell circuit 200) may include one or more decoupling structures (or elements) configured to control a current flow direction towards and from a memory cell (e.g., towards and from the memory cell 202), as illustrated in FIG. 2D. In various aspects, the one or more decoupling structures may be included in or may be part of a decoupling arrangement 214 (also referred to as decoupling circuit) of the memory cell circuit 200.

A decoupling structure (also referred to as protection structure) may be associated with a respective auxiliary terminal and with a respective auxiliary voltage supply terminal. A memory cell circuit may, in various aspects, include a decoupling structure for each auxiliary terminal. An auxiliary voltage supply terminal may be a terminal to which a generated auxiliary voltage is provided or supplied, e.g. a terminal to which an auxiliary voltage supply circuit is connected, as described for example in relation to FIG. 2E.

In some aspects, the decoupling structure may be connected between an auxiliary terminal and an auxiliary voltage supply terminal associated therewith, and may be configured to allow an operation of the memory cell 202 via the at least two control terminals 206 (e.g., via the first control terminal 206-1 and the second control terminal 206-2) without a substantial current flow from the associated auxiliary terminal to the associated auxiliary voltage supply terminal. Illustratively, a decoupling structure may be configured to prevent a substantial current flow from the associated auxiliary terminal in the direction of the associated auxiliary voltage supply terminal, e.g. during operation of the memory cell 202. In some aspects, the decoupling structure may be configured to allow a substantial current flow from the associated auxiliary voltage supply terminal in the direction of the associated auxiliary terminal, e.g. during a fabrication of the memory cell 202. Various examples of decoupling structures will be described in relation to FIG. 4A to FIG. 4D.

A decoupling structure may provide electrical decoupling between the memory cell 202 and the means used for generating (and providing) the auxiliary voltage to the memory cell 202. Illustratively, a decoupling structure may provide that, during operation, the memory cell 202 is electrically decoupled from the means used for generating the auxiliary voltage. In various aspects, the operation of the memory cell 202 may be carried out in such a way that electrical breakdown of the decoupling structure(s) is prevented. The control signals (e.g., the control voltages) provided (or required) for the operation of the memory cell 202 may be below a breakdown threshold associated with each decoupling structure (e.g., a voltage below a respective breakdown voltage associated with each decoupling structure). By way of example, the control signals for the operation of the memory cell 202 may be below a breakdown voltage of a decoupling diode, or below a threshold voltage of a decoupling transistor, described for example in FIG. 4A to FIG. 4D.

In various aspects, a substantial current flow may include a current greater than a leakage current of a decoupling structure. By way of example, a substantial current flow may be or may include a current greater than 10 nA or greater than 100 nA. In some aspects, a substantial current flow may be considered as prevented in case the current flow includes a current below 100 nA or below 10 nA.

A decoupling structure may be an active component or a passive component. An active decoupling structure may be controlled (e.g., switched) to prevent or allow a substantial current flow between the associated auxiliary terminal and auxiliary voltage supply terminal. A passive decoupling structure may have a predefined configuration, and the function of the passive decoupling structure may be determined by the direction of the current flow.

In the configuration illustrated in FIG. 2D, the memory cell circuit 200 may include a first auxiliary voltage supply terminal 216-1, and a first decoupling structure 214-1 connected between the first auxiliary terminal 212-1 and the first auxiliary voltage supply terminal 216-1. The first decoupling structure 214-1 may be configured to allow an operation of the memory cell 202 via the at least two control terminals 206 (e.g., via the first control terminal 206-1 and the second control terminal 206-2) without a substantial current flow from the first auxiliary terminal 212-1 to the first auxiliary voltage supply terminal 216-1. Illustratively, the first decoupling structure 214-1 may be configured to prevent a substantial current flow from the first auxiliary terminal 212-1 to the first auxiliary voltage supply terminal 216-1. In some aspects, the first decoupling structure 214-1 may be configured to allow a substantial current flow from the first auxiliary voltage supply terminal 216-1 to the first auxiliary terminal 212-1, e.g. during fabrication of the memory cell circuit 200.

The memory cell circuit 200 may include a second auxiliary voltage supply terminal 216-2, and a second decoupling structure 214-2 connected between the second auxiliary terminal 212-2 and the second auxiliary voltage supply terminal 216-2. The second decoupling structure 214-2 may be configured to allow an operation of the memory cell 202 via the at least two control terminals 206 without a substantial current flow from the second auxiliary terminal 212-2 to the second auxiliary voltage supply terminal 216-2. In some aspects, the second decoupling structure 214-2 may be of the same type or of a different type compared to the first decoupling structure 214-1, as described in further detail below.

It is understood that the number of decoupling structures of the memory cell circuit 200 may be adapted in accordance with the number of auxiliary terminals and auxiliary voltage supply terminals. For example, in case the memory cell circuit includes only one auxiliary terminal, the memory cell circuit 200 may include only one decoupling structure associated with that auxiliary terminal. As another example, in case the memory cell circuits 200 includes more than two auxiliary terminals (e.g., three, four, five, or more than five), the memory cell circuit 200 may include a corresponding number of decoupling structures (e.g., three, four, five, or more than five), each associated with a respective auxiliary terminal.

Figure 2E:
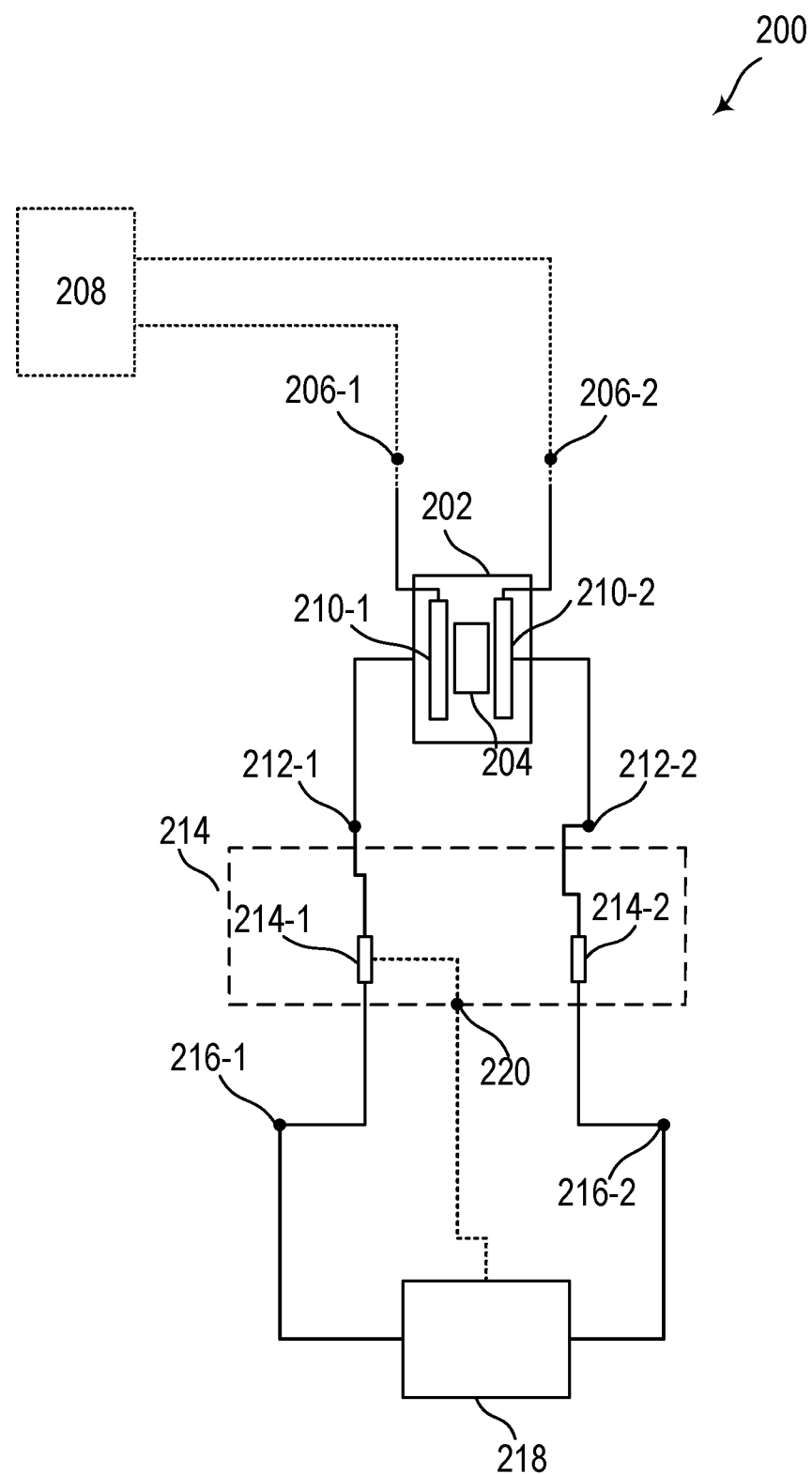

In various aspects, a memory cell circuit (e.g., the memory cell circuit 200) may include a circuit configured to generate the auxiliary voltage, as illustrated, for example, in FIG. 2E.

The memory cell circuit 200 may include an auxiliary voltage supply circuit 218 (also referred to as harvesting circuit or energy harvesting circuit) configured to generate the auxiliary voltage. In some aspects, the auxiliary voltage supply circuit 218 may be part of the memory cell circuit 200 or may be part of a memory cell arrangement including the memory cell circuit 200. In some aspects, the auxiliary voltage supply circuit 218 may be external to the memory cell circuit 200 or to the memory cell arrangement and only coupled thereto. Various examples for possible configurations of the auxiliary voltage supply circuit 218 will be described in relation to FIG. 5A and FIG. 5B.

The auxiliary voltage supply circuit 218 may be present in a memory cell circuit (or in a memory cell arrangement) after fabrication, e.g. in a final product, or it may be removed following the fabrication process (e.g., when the possibility of generating and supplying the auxiliary voltage is no longer required).

By way of example, the auxiliary voltage supply circuit 218 may be disposed in a region of a wafer onto which the memory cell circuit 200 is fabricated other than a chip region (e.g., other than a region in which the memory cell circuit or a plurality of memory cell circuits are arranged). As an example, the auxiliary voltage supply circuit 218 may be disposed in a kerf region of the wafer, and may be removed after the fabrication process, e.g. during singulation of the wafer portions (e.g., dies) including the memory cell circuit(s) or the memory cell arrangement(s). As another example, the auxiliary voltage supply circuit 218 may be a memory cell circuit-external or memory cell arrangement-external component that is (e.g., temporarily) connected to the memory cell circuit or the memory cell arrangement during the fabrication. As an explanation, the auxiliary voltage supply circuit 218 may be connected with associated contacts of the memory cell circuit or arrangement, and may be disconnected when the possibility of supplying the auxiliary voltage is no longer required.

In various aspects, the auxiliary voltage supply circuit 218 may be connected to one or more auxiliary voltage supply terminals of the memory cell circuit 200 (e.g., to provide a respective auxiliary voltage to the one or more auxiliary voltage supply terminals). Illustratively, the auxiliary voltage supply circuit 218 may be configured to generate or provide a respective auxiliary voltage to each auxiliary voltage supply terminal of the memory cell circuit 200. As illustrated in the representation in FIG. 2E, the auxiliary voltage supply circuit 218 may be connected to the first auxiliary voltage supply terminal 216-1 (e.g., to supply a first auxiliary voltage thereto), and to the second auxiliary voltage supply terminal 216-2 (e.g., to supply a second auxiliary voltage thereto, e.g. having a voltage value different compared to the first auxiliary voltage). In various aspects, the auxiliary voltage supply circuit 218 may be connected to the auxiliary terminals, e.g. to the first auxiliary terminal 212-1 and the second auxiliary terminal 212-2, without decoupling structures therebetween (e.g., in case no decoupling arrangement 214 is present, as described in further detail below).

The auxiliary voltage(s) generated by the auxiliary voltage supply circuit 218 or provided by the auxiliary voltage supply circuit 218 to the memory cell 202 may be configured (e.g., selected) to influence one or more electrical properties of the ferroelectric structure 204 and/or of the memory cell 202. Illustratively, the auxiliary voltage supply circuit 218 may be configured to provide auxiliary voltages that may control one or more electrical properties (and/or structural) of the ferroelectric structure 204, e.g. to provide auxiliary voltages that may bring the ferroelectric structure 204 (and/or the memory cell 202) into a predefined condition.

In various aspects, the auxiliary voltage supply circuit 218 may be configured to generate and/or provide one or more auxiliary control voltages (via one or more auxiliary control terminals 220), e.g. to a decoupling structure and/or to the memory cell 202, as described in further detail below.

The auxiliary voltage supply circuit 218 may be configured to provide a reference voltage (e.g., the base voltage) to at least one of the auxiliary voltage supply terminals (e.g., to at least one of the first auxiliary voltage supply terminal 216-1 or the second auxiliary voltage supply terminal 216-2). The reference voltage may be, for example, a ground voltage (e.g., the first auxiliary voltage or the second auxiliary voltage may be a ground voltage). By way of example, the auxiliary voltage supply circuit 218 may include a ground terminal or a connection to ground which is connected to one of the auxiliary voltage supply terminals.

In various aspects, the auxiliary voltage supply circuit 218 may be configured to generate an auxiliary current (e.g., one or more auxiliary currents). The generated auxiliary current(s) may be provided to an auxiliary voltage supply terminal (e.g., a first auxiliary current to the first auxiliary voltage supply terminal 216-1, and a second auxiliary current to the second auxiliary voltage supply terminal 216-2). By way of example, a plurality of generated auxiliary currents may be provided to a plurality of auxiliary voltage supply terminals associated with a plurality of memory cell circuits in a memory cell arrangement.

In various aspects, the decoupling arrangement 214 may be disposed between the memory cell 202 and the auxiliary voltage supply circuit 218. The decoupling arrangement 214 may be configured to allow an operation of the memory cell 202 via the at least two control terminals 206 (e.g., via the first control terminal 206-1 and the second control terminal 206-2) without a substantial current flow from the memory cell to the auxiliary voltage supply circuit 218. Illustratively, the decoupling arrangement 214 (e.g., the decoupling structures 214-1, 214-2) may be configured to electrically decouple the memory cell 202 from the auxiliary voltage supply circuit 218, e.g. during an operation of the memory cell 202 (e.g., in case the auxiliary voltage supply circuit 218 is present in the memory cell circuit 200 after fabrication). The decoupling arrangement 214 may be configured to allow a substantial current flow from the auxiliary voltage supply circuit 218 to the memory cell 202 (illustratively, to forward an electrical power from the auxiliary voltage supply circuit 218 to the memory cell 202).

In case the auxiliary voltage supply circuit 218 may be removed or disconnected after the fabrication, the decoupling arrangement 214 may be omitted. In this configuration, the memory cell 202 and the auxiliary voltage supply circuit 218 may be provided with a direct connection, illustratively without the decoupling arrangement 214 therebetween. In this case the decoupling may be, for example, a mechanical decoupling in which the memory cell 202 is physically disconnected from the auxiliary voltage supply circuit 218.

In some aspects, the decoupling arrangement 214 may have a first function (e.g., may be operated in a first operation mode), in which the decoupling arrangement 214 (in various aspects, the decoupling structure(s)) prevents a substantial current flow from the memory cell 202 to the auxiliary voltage supply circuit 218. Illustratively, the first function of the decoupling arrangement 214 may include the decoupling arrangement 214 behaving as a switch being "open", e.g. preventing a connection between the two sides of the switch. The decoupling arrangement 214 may have the first function during an operation of the memory cell 202, e.g. in case the control circuit 208 provides control signals to the memory cell 202. In the first function, the decoupling arrangement 214 may electrically decouple the memory cell 202 from the auxiliary voltage supply circuit 218. The first function may be the function of the decoupling arrangement 214 after the fabrication of the memory cell circuit 200.

The decoupling arrangement 214 may have a second function (e.g., may be operated in a second operation mode), in which the decoupling arrangement 214 allows a substantial current flow from the auxiliary voltage supply circuit 218 to the memory cell 202. Illustratively, the second function of the decoupling arrangement 214 may include the decoupling arrangement 214 behaving as a switch being "closed", e.g. providing a connection between the two sides of the switch. In some aspects, the second function may be mutually exclusive with the first function (e.g., the decoupling arrangement 214 may exhibit the functionality associated with the second function in case the decoupling arrangement 214 is not exhibiting the functionality associated with the first function). The second function may be during a fabrication of the memory cell circuit 200 (e.g., during a fabrication of the memory cell 202, for example during at least part of an annealing of the ferroelectric structure 204). In the second function, the decoupling arrangement 214 may electrically couple the memory cell 202 with the auxiliary voltage supply circuit 218.

An active decoupling structure (e.g., a decoupling transistor) may be switched between the first function and the second function, e.g. by a control signal, for example provided via an auxiliary control terminal of the memory cell circuit. A passive decoupling structure (e.g., a decoupling diode) may have the first function or the second function depending on the direction of the current flow.

In various aspects, the decoupling arrangement 214 may be configured to allow a substantial current flow from an auxiliary voltage supply terminal to the associated auxiliary terminal (e.g., from the first auxiliary voltage supply terminal 216-1 to the first auxiliary terminal 212-1 and/or from the second auxiliary voltage supply terminal 216-2 to the second auxiliary terminal 212-2). By way of example, the decoupling arrangement 214 may be configured to allow a substantial current flow from the auxiliary voltage supply circuit 218 to the at least one auxiliary terminal (e.g., to at least one of the first auxiliary terminal 212-1 or the second auxiliary terminal 212-2).

The decoupling arrangement 214 may be configured to forward an electrical power (e.g., a current and/or a voltage) provided to an auxiliary voltage supply terminal to the auxiliary terminal associated thereto. By way of example, the decoupling arrangement 214 may be configured to forward a (e.g., first) auxiliary voltage applied at the first auxiliary voltage supply terminal 216-1 to the first auxiliary terminal 212-1, and a (e.g., second) auxiliary voltage applied at the second auxiliary voltage supply terminal 216-2 to the second auxiliary terminal 212-2 (e.g., in the second function of the decoupling arrangement 214). Illustratively, the decoupling arrangement 214 may be configured such that a voltage drop between two auxiliary voltage supply terminals corresponds to a voltage drop between the respective auxiliary terminals (e.g., such that a voltage drop between the first auxiliary voltage supply terminal 216-1 and the second auxiliary voltage supply terminal 216-2 corresponds to a voltage drop between the first auxiliary terminal 212-1 and the second auxiliary terminal 212-2).

In various aspects, the memory circuit 200 may include one or more auxiliary control terminals 220, and the auxiliary voltage supply circuit 218 may be configured to provide one or more auxiliary control voltages to the one or more auxiliary control terminals 220. The one or more auxiliary control voltages may control (e.g., instruct), at least in part, the operation of one or more components of the memory cell circuit 200, e.g., the operation of one or more decoupling structures and/or part of the operation of the memory cell 202 (e.g., during fabrication), as described in further detail below. As an example, at least one of the decoupling structures (e.g., the first decoupling structure 214-1 or the second decoupling structure 214-2) may be coupled to an auxiliary control terminal to receive an auxiliary control voltage therefrom (e.g., a gate voltage in case the decoupling structure is a transistor). By way of example, an auxiliary control voltage may be used to control the operation mode of a decoupling structure (e.g., to switch the decoupling structure from the first function to the second function). In some aspects, the auxiliary voltage supply circuit 218 may be configured to generate the one or more auxiliary control voltages in a same process (e.g., in a same manner) as the one or more auxiliary voltages.

Possible exemplary configurations for a memory cell, e.g. for the memory cell 202, will now be described in relation to FIG. 3A and FIG. 3B, in accordance with various aspects.

Figure 3A:
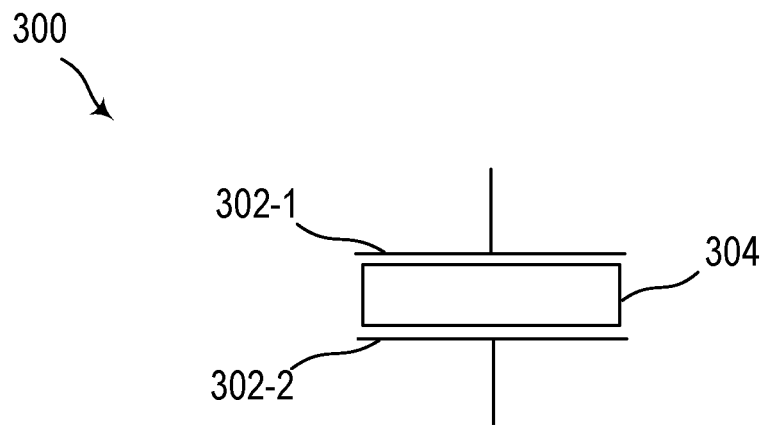
FIG. 3A, and FIG. 3B each show schematically a memory cell, according to various aspects.

A memory cell may include or be configured as a capacitor structure 300 (e.g., as a ferroelectric capacitor structure, also referred to as FeCAP or FeCAP structure), as illustrated in FIG. 3A. The capacitor structure 300 may include a first capacitor electrode 302-1 (e.g., a first conductive layer, such as a first metal layer), and a second capacitor electrode 302-2 (e.g., a second conductive layer, such as a second metal layer). It is understood that the configuration of the capacitor structure 300 is not limited to the configuration shown in FIG. 3A, but the capacitor structure may have any suitable shape, connection, or number of capacitor electrodes.

The capacitor structure 300 may include a ferroelectric structure 304 disposed between the first capacitor electrode 302-1 and the second capacitor electrode 302-2. By way of example, the first capacitor electrode 302-1 may be or correspond to the first contact element 210-1, the second capacitor electrode 302-2 may be or correspond to the second contact element 210-2, and the ferroelectric structure 304 may be or correspond to the ferroelectric structure 204 of the memory cell circuit 200 illustrated in FIG. 2A.

The electrodes of the capacitor structure 300 may be connected to respective control terminals and/or auxiliary terminals of a memory cell circuit (e.g., of the memory cell circuit 200). The first capacitor electrode 302-1 may be connected to a first control terminal (e.g., to the first control terminal 206-1), and the second capacitor electrode 302-2 may be connected to a second control terminal (e.g., to the second control terminal 206-2). Additionally or alternatively, the first capacitor electrode 302-1 may be connected to a first auxiliary terminal (e.g., to the first auxiliary terminal 212-1), and the second capacitor electrode 302-2 may be connected to a second auxiliary terminal (e.g., to the second auxiliary terminal 212-2).

A voltage drop across the ferroelectric structure 304 may be a voltage drop between the first capacitor electrode 302-1 and the second capacitor electrode 302-2. By way of example, a first voltage (e.g., a first control voltage or a first auxiliary voltage) may be provided to the first capacitor electrode 302-1, and a second voltage (e.g., a second control voltage or a second auxiliary voltage) may be provided to the second capacitor electrode 302-2. In various aspects, at least one of the first voltage and the second voltage may be a reference voltage, e.g. a ground voltage.

The capacitor structure 300 including the ferroelectric structure 304 may be used to implement memory functions, e.g. in a memory cell. In various aspects, the polarization state of the ferroelectric structure 304 may be switched by means of the capacitor structure 300. The polarization state of the ferroelectric structure 304 may also be read out by means of the capacitor structure 300. The polarization state of the ferroelectric structure 304 may define a memory state, e.g. of a memory cell. As an example, the polarization state of the ferroelectric structure 304 may determine the amount of charge stored in the capacitor structure 300. The amount of charge stored in the capacitor structure 300 may be used to define a memory state of the memory cell. In some aspects, a first amount of charge, for example great than 500 μC (but not limited to such a value), stored in the capacitor structure 300 may define a first memory state, and a second amount of charge, for example smaller than 500 μC (but not limited to such a value), stored in the capacitor structure 300 may define a second memory state.

In some aspects, a memory cell including the capacitor structure 300 may operate without having a field-effect transistor structure included in the memory cell, e.g. without basing the operation on a variation of a threshold voltage of a field-effect transistor structure. In some aspects, as another example, a memory cell including the capacitor structure 300 may operate in combination with a field-effect transistor structure included in the memory cell, e.g. a field-effect transistor structure connected with the capacitor structure 300. The threshold voltage of the field-effect transistor structure may depend on the charge stored in the capacitor structure, e.g. on the polarization state of the ferroelectric structure 304. A first threshold voltage, e.g. a high threshold voltage $V_{-H,th}$, may be associated with the first polarization state (e.g., with the first amount of stored charge), and a second threshold voltage, e.g. a low threshold voltage $V_{-L,th}$, may be associated with the second polarization state (e.g., with the second amount of stored charge).

In various aspects, a predefined condition of the capacitor structure 300 (e.g., a predefined condition of a memory cell configured as a capacitor structure) may include a predefined polarization state of the ferroelectric structure 304. In some aspects, a predefined condition of the capacitor structure 300 may include a predefined amount of charge stored in the capacitor structure 300. In some aspects, a predefined condition of the capacitor structure 300 may include a strength of an electric filed generated by the capacitor structure 300.

Figure 3B:
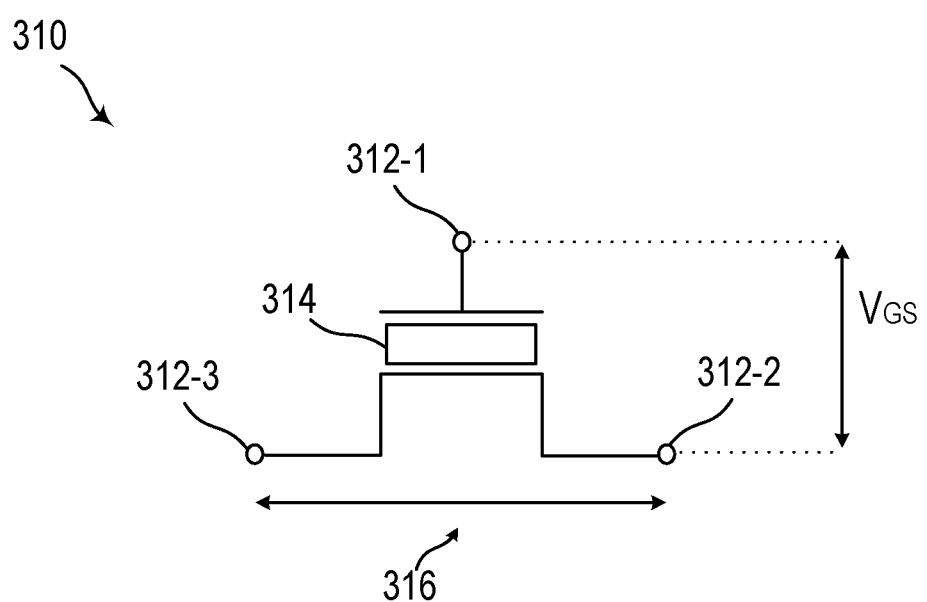

In various aspects, a memory cell may include or may be configured as a field-effect transistor structure 310 (e.g., as a ferroelectric field-effect transistor structure, also referred to as FeFET structure), as illustrated in FIG. 3B. The memory cell may be a field-effect transistor based memory cell, wherein one or more electronic properties of the field-effect transistor structure (e.g., a conductivity of a channel between two source/drain regions) may be influenced by a ferroelectric structure 314 of the memory cell (e.g., corresponding to or being configured as the ferroelectric structure 204 in FIG. 2A).

The memory cell (e.g., the field-effect transistor structure 310) may include one or more control nodes. As an example, the memory cell may include at least a second control node 312-2, a third control node 312-3, and a first control node 312-1 to control an electrical behavior of the second control node 312-2 and the third control node 312-3 of the memory cell (e.g., to control a current flow 316 between the second control node 312-2 and the third control node 312-3). According to various aspects, the memory cell may include two source/drain regions and a gate region (also referred to as gate structure) to control a current flow between the two source/drain region. As an example, the memory cell may include a gate node 312-1, a source node 312-2, and a drain node 312-3. The gate node 312-1 may be coupled to the gate region of the memory cell. The source node 312-2 may be coupled to the source region of the memory cell. The drain node 312-3 may be coupled to the drain region of the memory cell.

In various aspects, the control nodes may be or may correspond to contact elements of the memory cell. The gate node 312-1 may be a first contact element (e.g., the first contact element 210-1 or the second contact element 212-2 in FIG. 2A). The source node 312-2 may be a second contact element (e.g., the first contact element 210-1 or the second contact element 212-2 in FIG. 2A). The drain node 312-3 may be a third contact element.

According to various aspects, the drain current, ID, may vary as a function of a gate-source voltage, $V_{GS}$, provided to the memory cell and/or as a function of the memory state the memory cell is residing in. A current flow through the memory cell (e.g., a current coming out from the drain node 312-3) may reflect the memory state the memory cell is residing in, in the case that a gate-source voltage (e.g., a voltage drop between the gate node 312-1 and the source node 312-2), $V_{GS}$, provided to the memory cell falls between a first (e.g., low) threshold voltage, $V_{L-th}$, and a second (e.g., high) threshold voltage, $V_{H-th}$, of the memory cell.

The ferroelectric structure 314 may be disposed between the gate node 312-1 (e.g., a gate electrode) and a channel in which current may flow between the source node 312-2 and the drain node 312-3. The polarization state of the ferroelectric structure 314 may influence the conductivity of the channel, thus changing the threshold voltage of the memory cell According to various aspects, the memory cell may reside in a first memory state in the case that the ferroelectric structure 314 is in a first polarization state, and the memory cell may reside in a second memory state in the case that the ferroelectric structure 314 is in a second polarization state (e.g., opposite to the first polarization state). According to various aspects, the at least two threshold voltages of the memory cell (e.g. of the field effect transistor structure 310) may be a function of the residual polarization of the ferroelectric structure 314. Switching the state of the ferroelectric structure 314 from a first (e.g. positive) polarization state to a second (e.g. negative) polarization state, and vice versa, may thus allow switching the threshold voltage state of the memory cell, and accordingly a logic state associated therewith. According to various aspects, the at least two threshold voltages of a memory cell may be a function of the coercive field of the ferroelectric structure 314.

The one or more control nodes of the memory cell may be connected to respective control terminals and/or auxiliary terminals (or auxiliary control terminals) of a memory cell circuit (e.g., of the memory cell circuit 200).

In various aspects, a gate node 312-1 of the field-effect transistor structure 310 may be connected to a first control terminal of a memory cell circuit (e.g., to the first control terminal 206-1 of the memory cell circuit 200). A first source/drain node of the field-effect transistor structure 310 may be connected to a second control terminal (e.g., to the second control terminal 206-2 of the memory cell circuit 200). A second source/drain node of the field-effect transistor structure 310 may be connected to a third control terminal. In some aspects, one of the first source/drain node or the second source/drain node may be connected to a reference potential (e.g., a ground potential), e.g. may be connected to ground. In this configuration, an operation of the memory cell configured as a field-effect transistor structure may be controlled by providing readout voltages or writing voltages to the gate node and the source/drain nodes.

In various aspects, one of a first source/drain node or a gate node 312-1 of the field-effect transistor structure may be connected to a first auxiliary terminal of a memory cell circuit (e.g., to the first auxiliary terminal 212-1 of the memory cell circuit 200). The other one of the first source/drain node or the gate node 312-1 of the field-effect transistor structure may be connected to a second auxiliary terminal of the memory cell circuit (e.g., to the second auxiliary terminal 212-2 of the memory cell circuit 200). A second source/drain node of the field-effect transistor structure may be connected to an auxiliary control terminal (or to a third auxiliary terminal) of the memory cell circuit (e.g., to the auxiliary control terminal 220). In this configuration, a voltage drop may be provided across the ferroelectric structure 314, e.g. a voltage drop between the gate node 312-1 and the source node 312-2 of the field-effect transistor structure 310 (e.g., a gate-source voltage, $V_{GS}$). In some aspects, at least one of the first source/drain node or the second source/drain node may be provided with a ground voltage (e.g., may be connected to ground).

In various aspects, a first source/drain node of the field-effect transistor structure 310 may be connected to a first auxiliary terminal of a memory cell circuit (e.g., to the first auxiliary terminal 216-1 of the memory cell circuit 200). A second source/drain node of the field-effect transistor structure may be connected to a second auxiliary terminal of the memory cell circuit (e.g., to the second auxiliary terminal 216-2 of the memory cell circuit 200). A gate node 312-1 of the field-effect transistor structure 310 may be connected to an auxiliary control terminal (or to a third auxiliary terminal) of the memory cell circuit (e.g., to the auxiliary control terminal 220 of the memory cell circuit 200). In some aspects, at least one of the first source/drain node or the second source/drain node may be provided with a ground voltage.

According to various aspects, a memory cell may include an additional (e.g., a fourth) control node. A four terminal memory cell (also referred to as four node memory cell or four terminal device) may be, for example, a ternary memory cell (e.g. a Ternary Content Addressable Memory (TCAM) cell). The fourth control node may be connected with a respective (e.g., fourth) control terminal of a memory cell circuit and/or with a respective auxiliary terminal (or auxiliary control terminal).

Exemplary configurations of a decoupling arrangement (e.g., of the decoupling arrangement 214) and decoupling structures (e.g., the first decoupling structure 214-1 and the second decoupling structure 214-2) are illustrated in FIG. 4A, FIG. 4B, FIG. 4C, and FIG. 4D, in accordance with various aspects.

It is understood that the decoupling arrangement and the decoupling structures illustrated in FIG. 4A to FIG. 4D are provided only as an example. A decoupling structure may be or may include any element configured or controllable to provide the electrical decoupling function described in relation to FIG. 2D and FIG. 2E. Illustratively, a decoupling structure may be or may include any type of (e.g., passive or active) element configured or controlled to allow or prevent a substantial current flow between at least two portions of a circuit (e.g., between terminals of a memory cell circuit). Any combination of decoupling structures (e.g., any connection between respective terminals) may be provided.

Figure 4A:
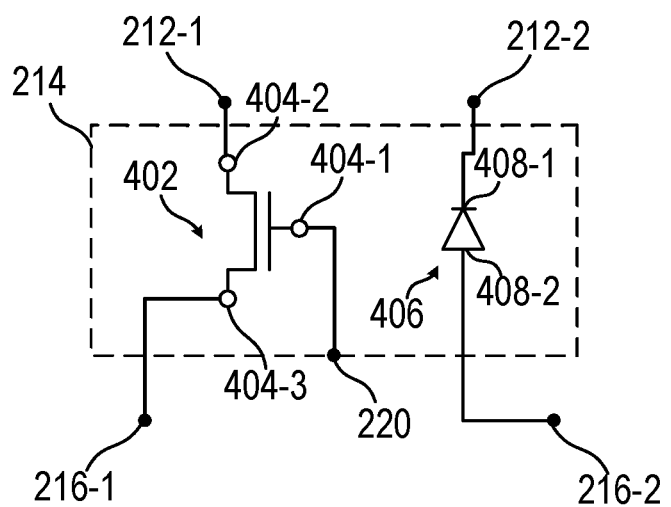
FIG. 4A, FIG. 4B, FIG. 4C, and FIG. 4D each show schematically a decoupling arrangement, according to various aspects.
Figure 4B:
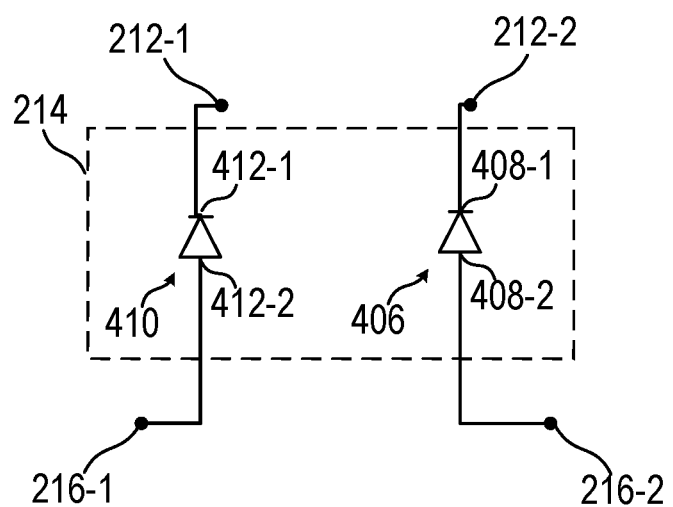
Figure 4C:
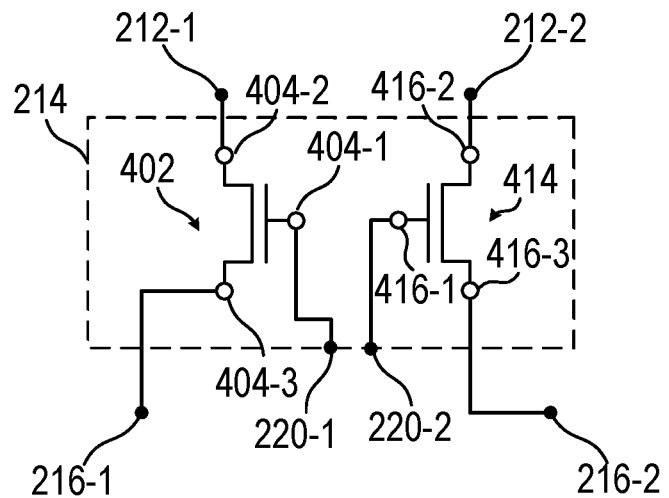

In various aspects, a first decoupling structure (e.g., the first decoupling structure 214-1) may be or may include a (e.g., first) decoupling transistor 402, as an example of active or controllable decoupling structure, as illustrated in FIG. 4A or FIG. 4C. The decoupling transistor 402 may include one or more control nodes, e.g. a gate node 404-1, a source node 404-2, and a drain node 404-3.

A first source/drain node of the decoupling transistor 402 may be connected to an auxiliary terminal of a memory cell circuit, e.g. to the first auxiliary terminal 212-1 (or the second auxiliary terminal 212-2) of the memory cell circuit 200. A second source/drain node of the decoupling transistor 402 may be connected to an auxiliary voltage supply terminal associated with the auxiliary terminal to which the first source/drain node is connected, e.g. may be connected to the first auxiliary voltage supply terminal 216-1 (or the second auxiliary voltage supply terminal 216-2) of the memory cell circuit 200. A gate node 404-1 of the decoupling transistor 402 may be connected to an auxiliary control terminal, e.g. to the auxiliary control terminal 220 of the memory cell circuit 200. By way of example, the source/drain node connected to the auxiliary voltage supply terminal may receive a reference voltage therefrom, e.g. a ground voltage. Illustratively, the source/drain node connected to the auxiliary voltage supply terminal may be connected to ground (e.g., via an auxiliary voltage supply circuit, or directly connected to ground).

In various aspects, a second decoupling structure (e.g., the second decoupling structure 214-2) may be or may include a (e.g., first) decoupling diode 406, e.g. as an example of passive decoupling structure, as illustrated in FIG. 4A and FIG. 4B. The decoupling diode 406 may include a cathode 408-1 and an anode 408-2. The cathode 408-1 may be connected to an auxiliary terminal of a memory cell circuit, e.g. to the second auxiliary terminal 212-2 (or the first auxiliary terminal 212-1) of the memory cell circuit 200. The anode 408-2 of the decoupling diode 406 may be connected to an auxiliary voltage supply terminal associated with the auxiliary terminal to which the cathode 408-1 is connected, e.g. to the second auxiliary voltage supply terminal 216-2 (or the first auxiliary voltage supply terminal 216-1) of the memory cell circuit 200. It is understood that the orientation of the diode 406, e.g. the connections between the cathode 408-1, the anode 408-2, and the respective auxiliary terminal and auxiliary voltage supply terminal may be adapted depending on the voltage received at the auxiliary voltage supply terminal. Illustratively, the configuration illustrated in FIG. 4A and FIG. 4B may be provided in case of positive voltage provided to the auxiliary voltage supply terminal. An inverted configuration of the diode 406 may be provided in case of negative voltage provided to the auxiliary voltage supply terminal.

In some aspects, the second decoupling structure may be a photo diode. The photo diode may be configured in a reverse direction, e.g. with respect to a direction of an auxiliary current provided by an auxiliary voltage supply circuit (e.g., by the auxiliary voltage supply circuit 218).

Figure 4D:
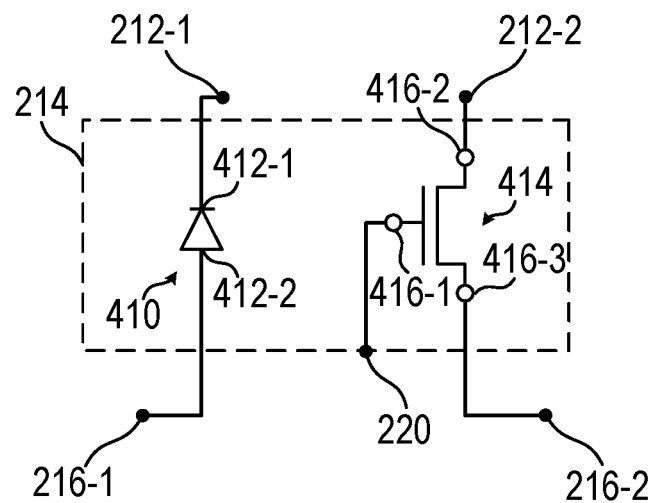

In various aspects, a first decoupling structure (e.g., the first decoupling structure 214-1) may be or may include a (e.g., second) decoupling diode 410, as illustrated in FIG. 4B and FIG. 4D. The second decoupling diode 410 may be configured as the first decoupling diode 406 and include a cathode 412-1 and an anode 412-2. The cathode 412-1 may be connected to an auxiliary terminal of a memory cell circuit, e.g. to the first auxiliary terminal 212-1 of the memory cell circuit 200. The anode 412-2 may be connected to the associated auxiliary voltage supply terminal, e.g. to the second auxiliary voltage supply terminal 216-2 of the memory cell circuit 200.

In various aspects, a second decoupling structure (e.g., the second decoupling structure 214-2) may be or may include a (e.g., second) decoupling transistor 414, as illustrated in FIG. 4C and FIG. 4D. The second decoupling transistor 414 may be configured as the first decoupling transistor 402 and may include one or more control nodes, e.g. a gate node 416-1, a source node 416-2, and a drain node 416-3.

A first source/drain node of the decoupling transistor 414 may be connected to an auxiliary terminal of a memory cell circuit, e.g. to the second auxiliary terminal 212-2 (or the first auxiliary terminal 212-1) of the memory cell circuit 200. A second source/drain node of the decoupling transistor 414 may be connected to the associated auxiliary voltage supply terminal, e.g. may be connected to the second auxiliary voltage supply terminal 216-2 (or the first auxiliary voltage supply terminal 216-1) of the memory cell circuit 200. A gate node 416-1 of the decoupling transistor 402 may be connected to an auxiliary control terminal of a memory cell circuit, e.g. to the auxiliary control terminal 220 or to a respective (e.g., second) auxiliary control terminal 220-2 of the memory cell circuit 200. Illustratively, the gate node 416-1 of the decoupling transistor 402 may be connected to a second auxiliary control terminal 220-2 in case the gate node 404-1 of the first decoupling transistor 402 is connected to a respective (first) auxiliary control terminal 220-1. In some aspects, the source/drain node connected to the auxiliary voltage supply terminal may receive a reference voltage therefrom, e.g. a ground voltage.

Figure 5A:
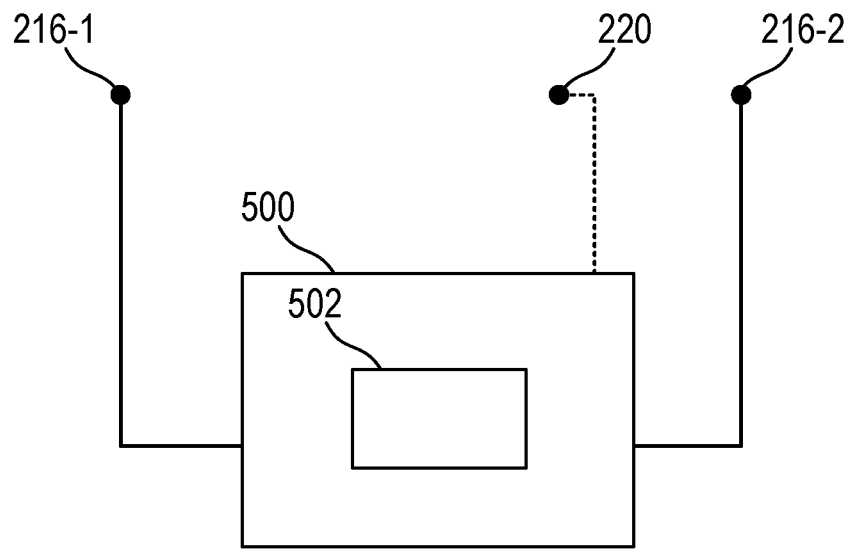
FIG. 5A shows schematically an auxiliary voltage supply circuit, according to various aspects.

An auxiliary voltage supply circuit 500 (e.g., the auxiliary voltage supply circuit 218) will now be described in relation to FIG. 5A and FIG. 5B.

In various aspects, the auxiliary voltage supply circuit 500 may include one or more power generating elements 502 (also referred to as harvesting elements) configured to generate electrical power (e.g., configured to generate a current and/or a voltage). The one or more power generating elements 502 may be configured to provide one or more auxiliary voltages and/or one or more auxiliary control voltages to one or more auxiliary voltage supply terminals (e.g., to the first auxiliary voltage supply terminal 216-1 and to the second auxiliary voltage supply terminal 216-2) and/or one or more auxiliary control terminals (e.g., the auxiliary control terminal 220) of a memory cell circuit, e.g. of the memory cell circuit 200.

The one or more power generating elements 502 may be associated with respective auxiliary voltage supply terminals or auxiliary control terminals. By way of example, in case the auxiliary voltage supply circuit 500 includes a plurality of power generating elements 502, a first power generating element or a first group of power generating elements may be associated with a first auxiliary voltage supply terminal of a memory circuit (e.g., with the first auxiliary voltage supply terminal 216-1) to supply electrical power thereto. A second power generating element or a second group of power generating elements may be associated with a second auxiliary voltage supply terminal of a memory circuit (e.g., with the second auxiliary voltage supply terminal 216-2) to supply electrical power thereto. Optionally, a third power generating element or a third group of power generating elements may be associated with an auxiliary control terminal of a memory circuit (e.g., with the auxiliary control terminal 220) to supply electrical power thereto. The first electrical power may have a different value (e.g., a different current value and/or voltage value) compared to the second electrical power and/or to the third electrical power. By way of example the first photo diode or the first group of photo diodes may be configured to generate a voltage having a voltage value in a first range (e.g., from about 1 V to about 2 V), and the second photo diode or the second group of photo diodes may be configured to generate a voltage having a voltage value in a second range (e.g., from about 5 V to about 10 V).

In various aspects, the auxiliary voltage supply circuit 500 may include at least one power generating element 502 configured to generate a reference voltage, e.g. a base voltage. Illustratively, the auxiliary voltage supply circuit 500 may include at least one connection to ground, e.g. connected to one of the auxiliary voltage supply terminals of a memory circuit (e.g., to the first auxiliary voltage supply terminal 216-1 or the second auxiliary voltage supply terminal 216-2).

In various aspects, the auxiliary voltage supply circuit 500 may be connected directly to a memory cell (e.g., to the memory cell 202). Illustratively, a memory cell circuit may be configured as a combination of the memory cell circuit 200 illustrated in FIG. 2A with the auxiliary voltage supply circuit 500 illustrated in FIG. 5A (and/or FIG. 5B). In this configuration, the auxiliary voltage supply circuit 500 may provide electrical power to the auxiliary terminals of the memory cell circuit (e.g., directly, without a decoupling arrangement or structures therebetween).

In various aspects, the one or more power generating elements 502 may be configured to convert electromagnetic radiation into an electrical power (e.g., into a current, such as a photo current, or a voltage). Illustratively, the auxiliary voltage supply circuit 500 may include one or more power generating elements 502 configured (e.g., arranged) to receive electromagnetic radiation and to convert the received electromagnetic radiation into an electrical power.

By way of example the one or more power generating elements 502 may include at least one antenna (e.g., a rectifying antenna, a loop antenna, etc.) configured to receive RF (radio frequency) signal and to convert the received RF signal into electrical power. As another example, the one or more power generating elements 502 may include at least one conductor (e.g., a coil, such as a reception coil) configured to be inductively coupled with another conductor (e.g., external to the auxiliary voltage supply circuit).

Figure 5B:
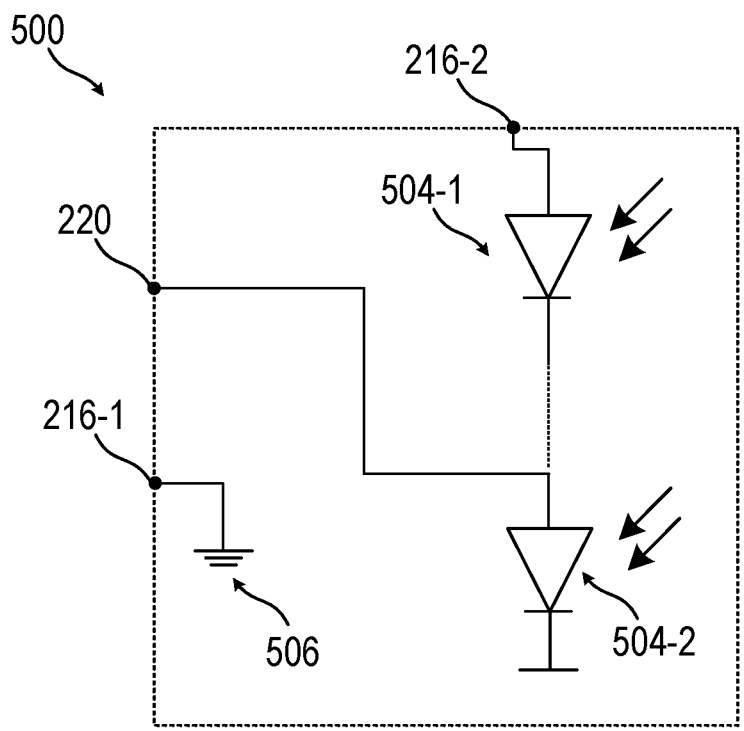
FIG. 5B shows schematically an exemplary implementation of an auxiliary voltage supply circuit, according to various aspects.

In various aspects, the one or more power generating elements 502 may be or may include one or more photo diodes (e.g., the one or more power generating elements 502 may include at least one photo diode), as illustrated in FIG. 5B. The one or more photo diodes may be fabricated, for example, by means of CMOS technology, as described in further detail below. In various aspects, in case the one or more photo diodes include a plurality of photo diodes, the photo diodes may be connected in series to one another. By way of example, the photo diodes of the plurality of photo diodes may be stacked one on top of the other. In various aspects, the one or more photo diodes (e.g., at least one photo diode) may be configured to operate in photovoltaic mode, e.g. zero biased.

The one or more photo diodes may be configured to convert light into electrical power. The one or more photo diodes may be configured to receive light (e.g., as part of the annealing radiation during a fabrication of a memory cell circuit) and to convert the received light into electrical power. In some aspects, the light may be included in an annealing radiation used to anneal a memory cell. In various aspects, the one or more photo diodes may be sensitive in a wavelength range corresponding to a wavelength range of light used for annealing a memory cell or a ferroelectric structure. By way of example, at least one photo diode may be sensitive in a wavelength range from about 100 nm to about 1500 nm, for example from about 500 nm to about 1000 nm.

In various aspects, the one or more photo diodes may be configured to sustain a temperature reached during an annealing process, e.g. during an annealing of a memory cell or a ferroelectric structure. By way of example, the one or more photo diodes may be configured to operate (illustratively, without a decrease in the light conversion efficiency) at a temperature greater than about 200° C., for example at a temperature greater than about 500° C. As another example, the one or more photo diodes may be configured to operate at a temperature in the range from about 300° C. to about 1000° C. Illustratively, at least one photo diode (e.g., each photo diode) may be or may be configured as a high temperature photo diode.

In the exemplary configuration illustrated in FIG. 5B, the auxiliary voltage supply circuit 500 may include a first photo diode 504-1 (e.g., a first group of photo diodes) and a second photo diode 504-2 (e.g., a second group of photo diodes). The first photo diode 504-1 may be connected to an auxiliary voltage supply terminal of a memory cell circuit, e.g. to the second auxiliary voltage supply terminal 216-2 of the memory cell circuit 200. The second photo diode 504-2 may be connected to an auxiliary control terminal of a memory cell circuit, e.g. to the auxiliary control terminal 220 of the memory cell circuit 200. The auxiliary voltage supply circuit may include a connection to ground 506, e.g. an auxiliary voltage supply terminal of a memory circuit, may be connected to ground via the auxiliary voltage supply circuit.

In various aspects, the one or more power generating elements 502 (e.g., the one or more photo diodes) may be formed over the substrate (e.g., on the substrate) and/or in the substrate (illustratively, over and/or in the substrate in which the memory cell circuit is formed, e.g. over and/or in a wafer). In various aspects, at least one power generating element 502 (e.g., at least one photo diode) of the one or more power generating elements 502 may be or may include a structure arranged (e.g., formed, e.g. attached) on the surface of the substrate. In various aspects, at least one power generating element 502 of the one or more power generating elements 502 may be or may include a structure formed within the substrate (e.g., a structure integrated into the substrate), such as a deep n type well structure in case of a photo diode. In various aspects, at least one power generating element 502 of the one or more power generating elements 502 may be or may include a structure having a portion formed over the substrate and a portion formed in the substrate.

A memory cell arrangement and exemplary realizations of a memory cell arrangement will be described in relation to FIG. 6A to FIG. 6C.

In various aspects, a memory cell arrangement may include a plurality of memory cell circuits (e.g., a plurality of memory cell circuits 200). By way of example, a memory cell arrangement may include a plurality of memory cell circuits arranged in an array (e.g., in a matrix). By way of example, a memory cell arrangement may include a plurality of memory cell circuits configured as described in relation to FIG. 2A and FIG. 2D.

A memory cell arrangement may include an auxiliary voltage supply circuit (e.g., a common circuit) coupled to each memory cell circuit of the plurality of memory cell circuits. The auxiliary voltage supply circuit may provide electrical power to the respective auxiliary voltage supply terminals (or directly to the auxiliary terminals) of the memory cell circuits. Illustratively, the auxiliary voltage supply circuit may be configured to generate the respective auxiliary voltage for each memory cell circuit of the plurality of memory cell circuits.

Each memory cell circuit of the plurality of memory cell circuits may include a respective first auxiliary terminal and a respective second auxiliary terminal (connected with respective first and second auxiliary voltage supply terminal). Illustratively, the memory cell arrangement may include a plurality of auxiliary terminal pairs (and a plurality of auxiliary voltage supply terminal pairs), each associated with (e.g., connected to) a respective memory cell circuit of the plurality of memory cell circuits. The respective first auxiliary terminal and second auxiliary terminal of a memory cell circuit may be connected to the memory cell (or cells, e.g. in case of a string) of the associated memory cell circuit.

Each memory cell circuit of the plurality of memory cell circuits may include a respective first control terminal and a respective second control terminal configured to allow an operation of the memory cell (or cells) of the memory cell circuit.

In various aspects, the memory cell arrangement may include a control circuit (e.g., configured as the control circuit 208) configured to control a write operation and/or a read operation of the plurality of memory cell circuits. The control circuit may be understood as an addressing circuit configured to address the plurality of memory cell circuits, e.g. all the memory cell circuits in a row or in a column, as an example.

The memory cell arrangement may include a plurality of control lines, e.g. a plurality of word-lines and a plurality of source/bit-lines, configured to deliver one or more control signals to the memory cell circuits (illustratively, to the respective control terminals). As an example, a word-line may be connected with a gate node of a field-effect transistor based memory cell, a first source/bit-line may be connected with one of the source node or drain node of the memory cell, and a second source-bit line may be connected with the other one of the source node or the drain node of the memory cell. A control signal may be or may include, for example, a voltage or a current (a control voltage or a control current).

The control terminals of a (e.g., each) memory cell circuit may be connected with the control circuit, e.g. via the control lines. Illustratively, the respective (first and second) control terminals of each memory cell circuit may each be connected to respective control lines to allow a control of the memory cell circuit (e.g., the first control terminal of a memory cell circuit may be connected to a first control line, e.g. a word-line, and the second control terminal of a memory cell circuit may be connected to a second control line, e.g. a source/bit-line).

The (first and second) auxiliary terminals of a (e.g., each) memory cell circuit are not connected with the control circuit, e.g. are not connected to any control line (to any word-line and to any source/bit-line). The auxiliary terminals of a memory cell circuit do not contribute or take part in the control of the memory cell circuit, e.g. do not contribute or take part in the addressing of the memory cell circuit. Stated in a different fashion, the auxiliary terminals of a memory cell circuit are disposed (e.g., connected to the memory cell circuit, and to the rest of the memory cell arrangement) in such a way that the auxiliary terminals do not receive (and do not deliver) any control signal to the memory cell circuit (any signal, e.g. any voltage, associated with a write operation or read operation of the memory cell circuit). Illustratively, the auxiliary terminals of a memory cell circuit are distinct from the control terminals, and are disconnected from the control circuit (and from the control lines). The auxiliary terminals of a memory cell circuit do not contribute to the control of the write operation and/or read operation of the memory cell circuit.

In various aspects, the memory cell arrangement may include at least one common decoupling structure arranged between the auxiliary voltage supply circuit and a common (e.g., first) auxiliary voltage supply terminal connected to each memory cell circuit of the plurality of memory cell circuits. Illustratively, in addition or in alternative to each memory cell circuit having a respective decoupling arrangement, the memory cell arrangement may include a decoupling structure (e.g., passive or active) configured (e.g., controlled) to allow an operation of the memory cell circuits without a substantial current flow from the memory cell circuits to the auxiliary voltage supply circuit. In some aspects, the common decoupling structure may be configured to prevent a substantial current flow from each memory cell circuit of the plurality of memory cell circuits to the auxiliary voltage supply circuit during an operation of the respective memory cell of the memory cell circuits.

Figure 6A:
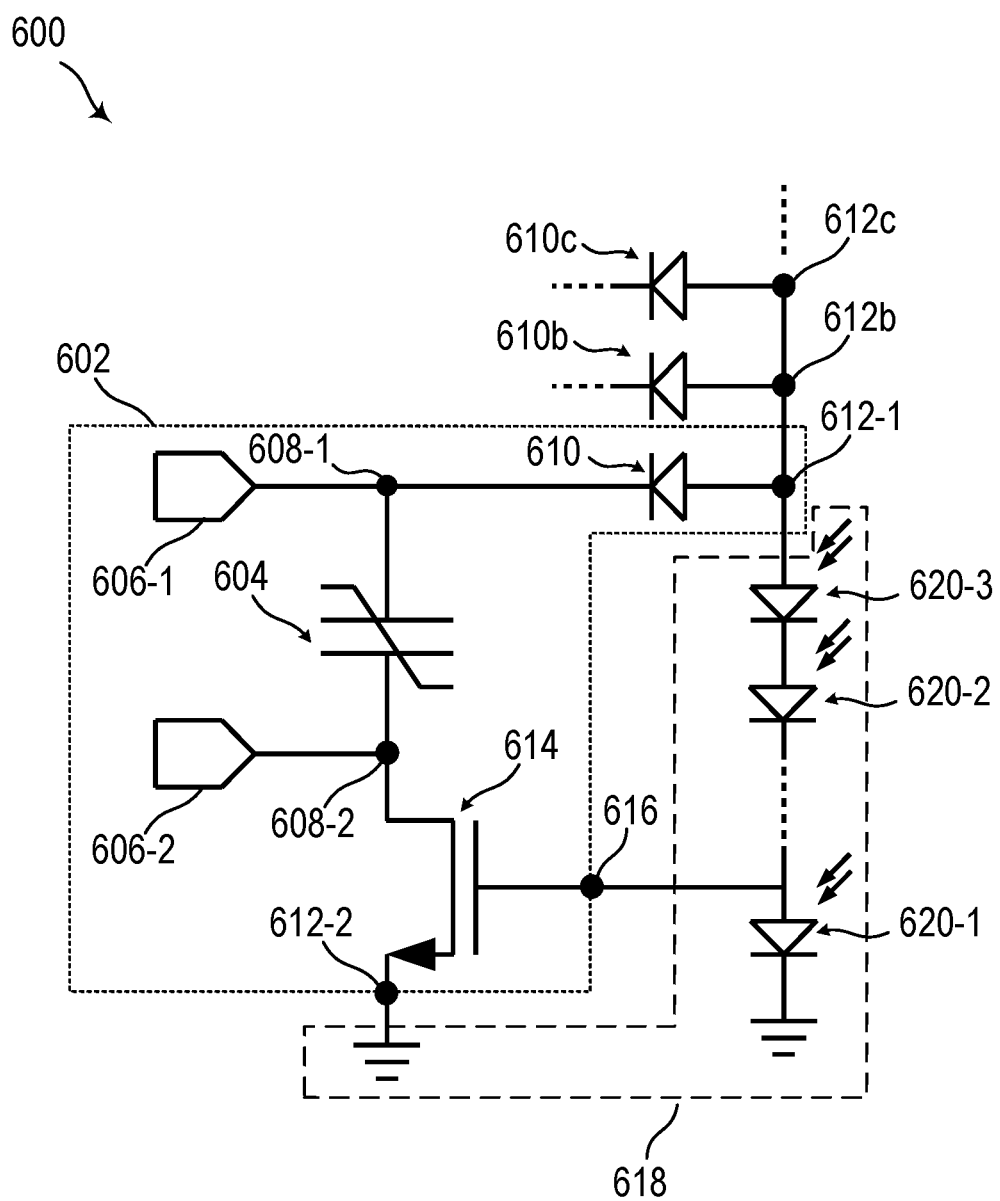
FIG. 6A, FIG. 6B, and FIG. 6C each show schematically an exemplary implementation of a memory cell arrangement, according to various aspects.
Figure 6B:
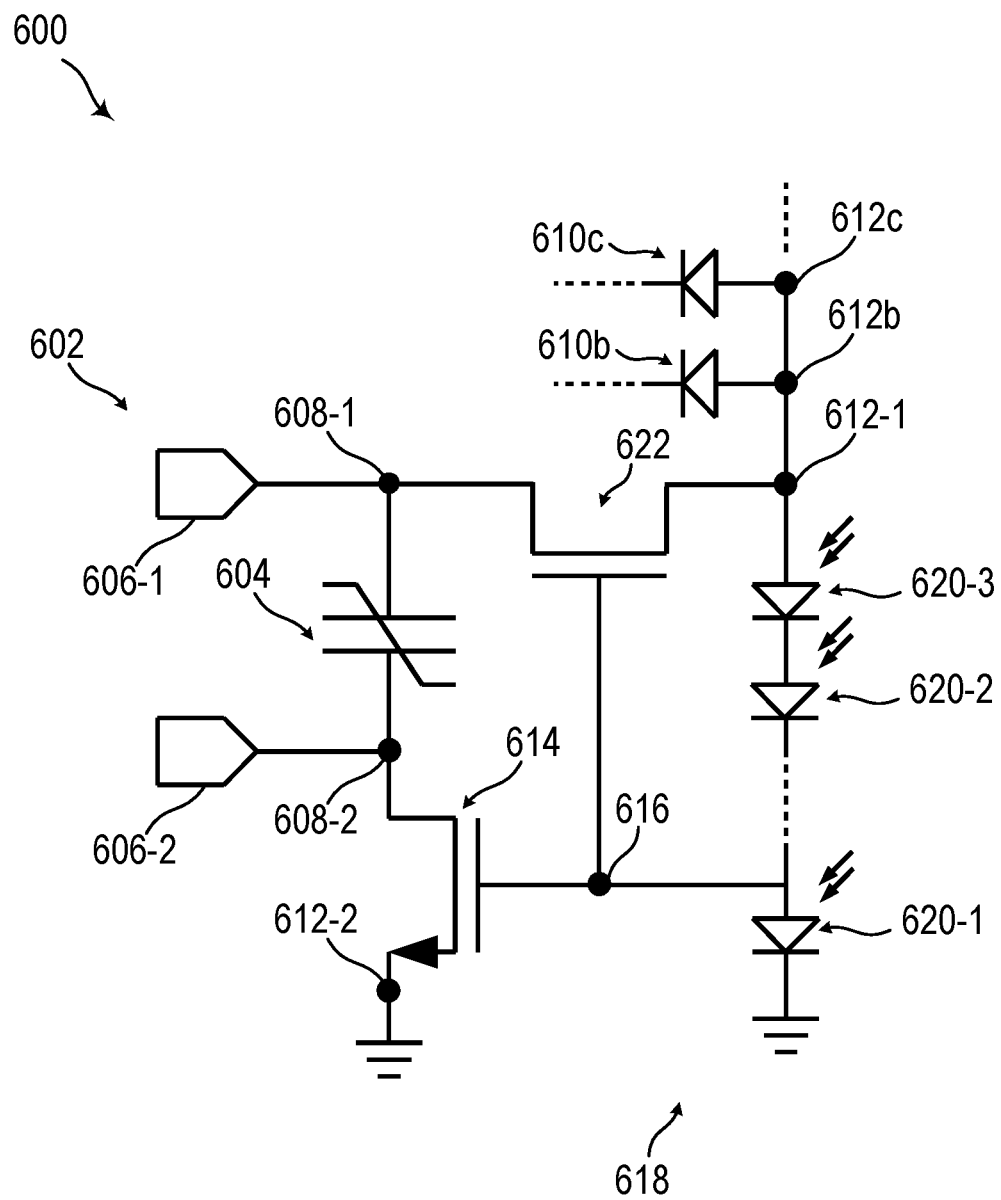
Figure 6C:
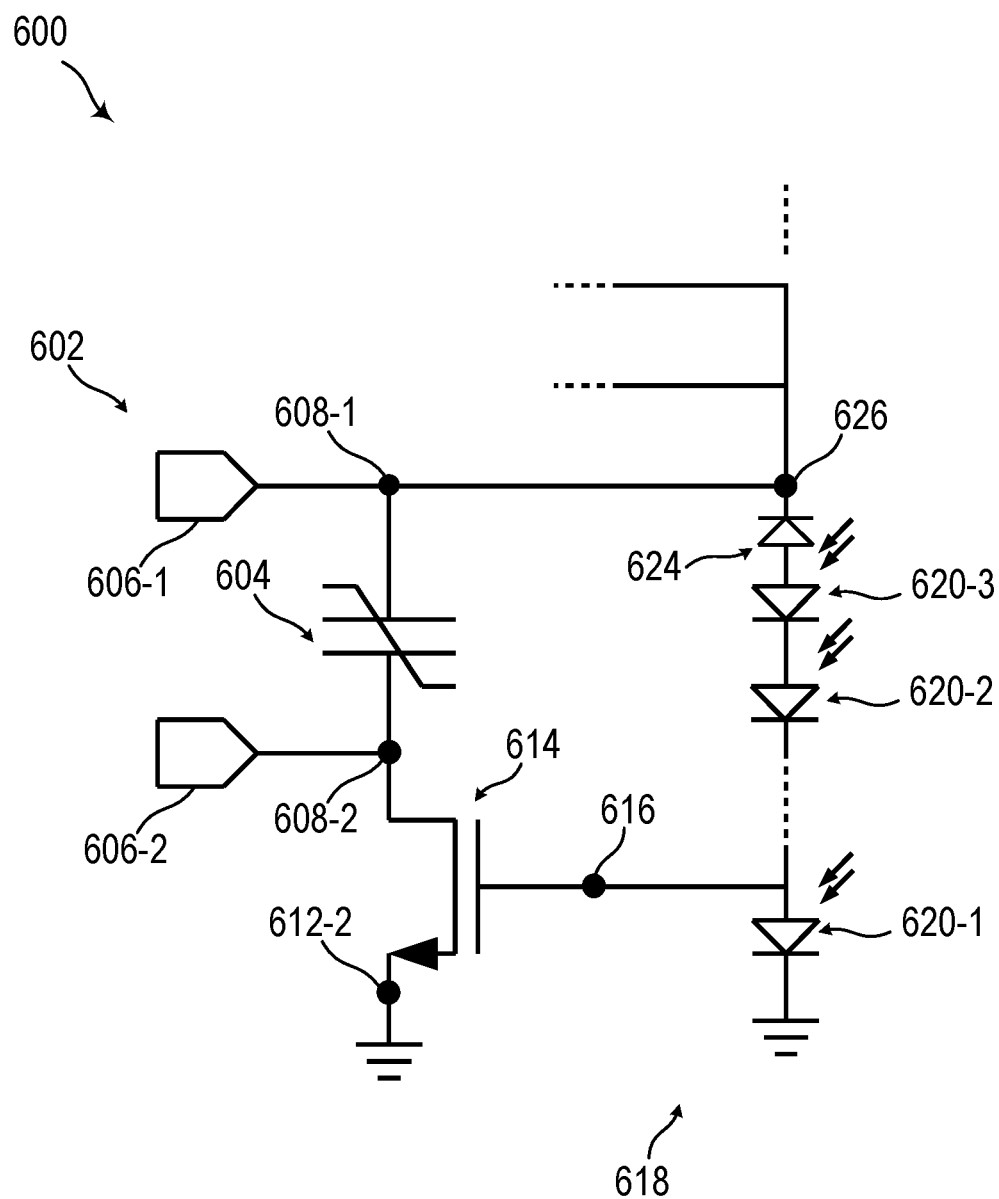

An exemplary realization of a memory cell arrangement 600 is illustrated in FIG. 6A, FIG. 6B, and FIG. 6C. It is understood that the configuration illustrated in FIG. 6A, FIG. 6B, and FIG. 6C is provided only as an example, and the memory cell arrangement 600 may have any configuration providing an operation as described herein.

The memory cell arrangement 600 may include a plurality of memory cell circuits 602. In the representation in FIG. 6A, FIG. 6B, and FIG. 6C only one memory cell circuit 602 is shown, however it is understood that other memory cell circuits may be present, configured as the memory cell circuit 602, and arranged, for example, in a same row or column of the memory cell arrangement 600 as the memory cell circuit 602.

A memory cell circuit 602 may include a ferroelectric memory cell 604, for example configured as a ferroelectric capacitor structure (e.g., the memory cell may be a FeCAP memory cell). The memory cell circuit 602 may include at least two control terminals, e.g. a first control terminal 606-1 and a second control terminal 606-2 connected to the memory cell 604 (e.g., to the electrodes of the capacitor structure) to allow an operation of the memory cell 604.

The at least two control terminals may be connected to respective addressing elements (e.g., respective access elements) of the memory cell arrangement 600. The first control terminal 606-1 may be connected to a first addressing element and the second control terminal 606-2 may be connected to a second addressing element. The addressing elements may be or may include a control line (e.g. a word-line, a bit-line, or a source-line) of the memory cell arrangement 600. The at least two control terminals (e.g., via the addressing elements or directly) may be coupled with a control circuit or any type of addressing device configured to control an operation of the memory cell circuits 602 of the memory cell arrangement 600.

The memory cell circuit 602 may include a first auxiliary terminal 608-1 and a second auxiliary terminal 608-2 connected to the memory cell 604 (e.g., to the electrodes of the ferroelectric capacitor structure) to provide an auxiliary voltage thereto. The memory cell circuit 602 may include a decoupling diode 610 connected between the first auxiliary terminal 608-1 and a first auxiliary voltage supply terminal 612-1 to prevent a substantial current flow from the first auxiliary terminal 608-1 to the first auxiliary voltage supply terminal 612-1 (e.g., during an operation of the memory cell circuit 602). The memory cell circuit 602 may include a decoupling transistor 614 connected between the second auxiliary terminal 608-2 and a second auxiliary voltage supply terminal 612-2 to prevent a substantial current flow from the second auxiliary terminal 608-2 to the second auxiliary voltage supply terminal 612-2 (e.g., during an operation of the memory cell circuit 602). The decoupling transistor 614 may be a pull-down transistor, e.g. may include a source/drain node connected to a reference voltage (e.g., to a ground voltage). As illustrated in FIG. 6A, a source/drain node of the decoupling transistor 614 may be connected to ground, for example provided by an auxiliary voltage supply circuit 618, described in further detail below. The decoupling transistor 614 may include a gate node connected to an auxiliary control terminal 616 to receive a control voltage therefrom (e.g., via the auxiliary voltage supply circuit, for example via a first stage of photo diodes of the auxiliary voltage supply circuit). The control voltage received at the gate node may provide a connection between a source node and a drain node of the decoupling transistor 614, illustratively to provide the auxiliary voltage received at the second auxiliary voltage supply terminal 612-2 to the second auxiliary terminal 608-2. Illustratively, the voltage generated by a first stage of photo diodes may be used to enable the pull-down transistor to ground the bottom electrode of the FeCAP memory cell.

In the configuration illustrated in FIG. 6A, each memory cell circuit may include a respective decoupling structure (e.g., a respective diode) connected at a respective auxiliary voltage supply terminal. By way of example a second memory cell circuit may include a decoupling diode 610b connected to an auxiliary voltage supply terminal 612b of the second memory cell circuit, a third memory cell circuit may include a decoupling diode 610c connected to an auxiliary voltage supply terminal 612c of the third memory cell circuit, etc.

In some aspects, the decoupling diode(s) may be replaced by a photo diode (e.g., by individual photo diodes) in reverse direction.

The memory cell arrangement 600 may include an auxiliary voltage supply circuit 618. The auxiliary voltage supply circuit 618 may provide the auxiliary voltage(s) to each memory cell circuit of the memory cell arrangement. Illustratively, the auxiliary voltage supply circuit 618 may be connected to the respective auxiliary voltage supply terminals associated with the memory cell circuits.

The auxiliary voltage supply circuit 618 may include a plurality of photo diodes. In the configuration illustrated in FIG. 6A, the auxiliary voltage supply circuit 618 may include a first photo diode 620-1 (e.g., a first group or first stage of photo diodes) connected to the auxiliary control terminal 616. Illustratively, the auxiliary voltage supply circuit 618 may include a group of first photo diodes for generating control voltages for the decoupling transistors of the plurality of memory cell circuits. The auxiliary voltage supply circuit 618 may include a plurality of other photo diodes (e.g., a second photo diode 620-2, a third photo diode 620-3, etc.) to generate the auxiliary voltage(s), e.g. auxiliary current(s), provided to the auxiliary voltage supply terminal(s) of the memory cell circuits.

In the exemplary representation in FIG. 6A, the photo diodes generate a forward bias voltage. The output voltage of the photo diodes is used to bias multiple FeCAP memory cells (each decoupled by the respective diode). It is understood that the memory cells may also include or may also be configured as FeFET memory cells.

As illustrated in the exemplary configuration in FIG. 6B, the memory cell circuit 602 may include a further (e.g., second) decoupling transistor 622, e.g. instead of the decoupling diode 610. The further decoupling transistor 622 may include a first source/drain node connected to the first auxiliary terminal 608-1 and a second source/drain node connected to the first auxiliary voltage supply terminal 612-1. The gate node of the further decoupling transistor 622 may be connected to an auxiliary control terminal, e.g. to the auxiliary control terminal 616 or to a further auxiliary control terminal, to receive a control voltage therefrom.

As illustrated in the exemplary configuration in FIG. 6C, the memory cell may include a common decoupling structure, e.g. a common decoupling diode 624. The common decoupling diode 624 may be arranged between the auxiliary voltage supply circuit 618 and the auxiliary voltage supply terminals of the memory cell circuits. Illustratively, the common decoupling diode 624 may be arranged between the auxiliary voltage supply circuit 618 and at least one auxiliary voltage supply terminal 626 common to each memory cell circuit (e.g., connected to each memory cell circuit). As an explanation, the common decoupling diode 624 may be disposed between the auxiliary voltage supply circuit and a common auxiliary voltage supply terminal 626 to which each memory cell circuit is connected (e.g., to which at least one auxiliary voltage supply terminal of each memory cell circuit is connected).

In the representation in FIG. 6C, the common decoupling diode 624 is shown as an alternative to the decoupling diodes of the memory cell circuits. However, the common decoupling diode 624 may be used in combination with the respective decoupling diodes of the memory cell circuits, e.g. to provide further control over the current flow.

It is understood, that the memory cell arrangement may include a common decoupling transistor in addition or in alternative to the common decoupling diode, e.g. including a gate node connected to a control terminal (e.g., to an auxiliary control terminal).

Figure 7:
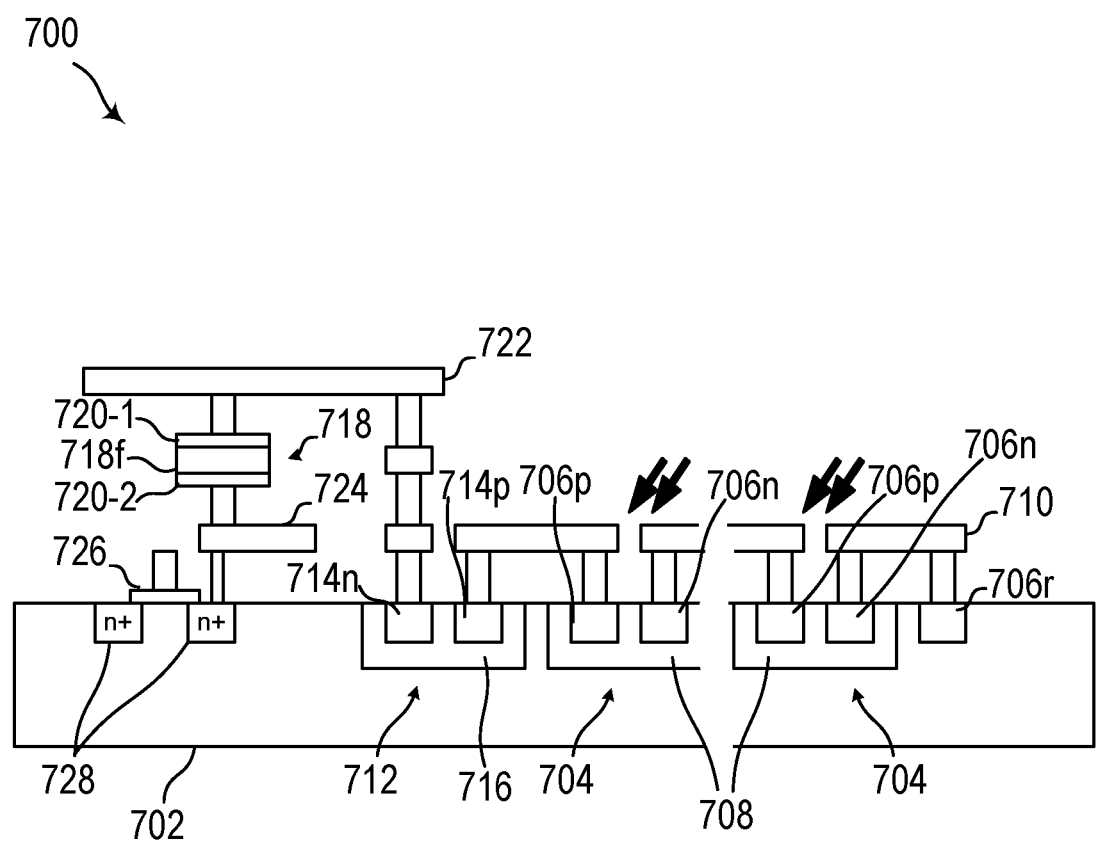
FIG. 7 shows schematically an integration scheme of a memory cell circuit, according to various aspects.

FIG. 7 illustrates an exemplary integration scheme for a memory cell circuit 700 (e.g., for the memory cell circuit 200). It is understood that the scheme shown in FIG. 7 is only an example, and any other implementation or integration of the components of the memory cell circuit may be provided.

The memory cell circuit 700 may be integrated in a substrate 702, e.g. a silicon substrate (e.g., a silicon wafer). The substrate 702 may a p-substrate (e.g., p-doped) or a n-substrate (e.g., n-doped).

The memory cell circuit 700 may include a plurality of photo diodes 704, e.g. a first photo diode, a second photo diode, a third photo diode, etc. The photo diodes 704 may include a pn-junction, e.g. each photo diode 704 may include a p-doped region 706$p$ and an n-doped region 706$n$ within a n-well 708 (or a p-well in case of a n-substrate).

In some aspects, the photo diodes 704 may be connected to one another (and to a decoupling diode 712) by a metallization 710, e.g. by one or more metal lines. The metallization may be provided such that at least a portion of each photo diode 704 is exposed to receive light. In some aspects, at least one photo diode may be connected to ground, e.g. to a p-doped region 706$r$ in the p-substrate 702 (or to an n-doped region in an n-substrate).

The memory cell circuit 700 may include a decoupling diode 712 (also referred to as protection diode). The decoupling diode 712 may include a pn-junction, e.g. may include an n-doped region 714$n$ and a p-doped region 714$p$ within an n-well 716 (or within a p-well in case of an n-doped substrate). The decoupling diode 712 may be connected to at least one photo diode 704, e.g. via the metallization 710.

The memory cell circuit 700 may include a memory cell 718, e.g. configured as a ferroelectric capacitor. The memory cell 718 may include a ferroelectric structure 718 arranged between at least two electrodes of the capacitor structure (e.g., between a first electrode 720-1 and a second electrode 720-2). The memory cell 718 may be accessed via a corresponding metallization, e.g. a first metallization 722 to access the first electrode 720-1 (e.g., a top electrode) and a second metallization 724 to access a second electrode (e.g., a bottom electrode) of the capacitor structure. As an example, the first electrode 220-1 (e.g., via the first metallization 722) may be connected with the decoupling diode 712. The second electrode (e.g., via the second metallization 724) may be connected with a decoupling transistor 726 (e.g., a transistor structure connecting two n-doped regions 728 (or two p-doped regions)).

In the following, various aspects of this disclosure will be illustrated. The aspects may be related to the method 100, the memory cell circuit 200, 700, and the memory cell arrangement 600.

Example 1 is a memory cell circuit including: a memory cell, the memory cell including a ferroelectric structure; a first control terminal and a second control terminal connected to the memory cell, the first control terminal and the second control terminal being configured to allow an operation of the memory cell; a first auxiliary terminal and a second auxiliary terminal connected to the memory cell, the first auxiliary terminal and the second auxiliary terminal being configured to provide an auxiliary voltage to the ferroelectric structure.

In Example 2, the memory cell circuit of example 1 may optionally include that allowing an operation of the memory cell may include allowing a reading of the memory cell and/or allowing a writing of the memory cell. Writing of a memory cell may include programming the memory cell and/or erasing of the memory cell.

In Example 3, the memory cell circuit of example 1 or 2 may optionally include a first auxiliary voltage supply terminal and a first decoupling structure connected between the first auxiliary voltage supply terminal and the first auxiliary terminal. The first decoupling structure may be configured to allow an operation of the memory cell via the first control terminal and the second control terminal without a substantial current flow from the first auxiliary terminal to the first auxiliary voltage supply terminal.

In some aspects, a substantial current may be a current above a leakage current (e.g., of the first decoupling structure), for example a current above 10 nA or above 100 nA.

In Example 4, the memory cell circuit of example 3 may optionally include that the first decoupling structure includes a first decoupling diode.

In Example 5, the memory cell circuit of example 4 may optionally include that a cathode of the first decoupling diode is connected to the first auxiliary terminal and an anode of the first decoupling diode is connected to the first auxiliary voltage supply terminal.

In Example 6, the memory cell circuit of example 3 may optionally include that the first decoupling structure includes a first decoupling transistor.

In Example 7, the memory cell circuit of example 6 may optionally include that a first source/drain node of the first decoupling transistor is connected to the first auxiliary terminal, a second source/drain node of the first decoupling transistor is connected to the first auxiliary voltage supply terminal, and a gate node of the first decoupling transistor is connected to an auxiliary control terminal (e.g., a first auxiliary control terminal).

In Example 8, the memory cell circuit of any one of examples 3 to 7 may optionally further include a second auxiliary voltage supply terminal, and a second decoupling structure connected between the second auxiliary terminal and the second auxiliary voltage supply terminal. The second decoupling structure may be configured to allow an operation of the memory cell via the first control terminal and the second control terminal without a substantial current flow from the second auxiliary terminal to the second auxiliary voltage supply terminal.

In some aspects, a substantial current may be a current above a leakage current (e.g., of the second decoupling structure), for example a current above 10 nA or above 100 nA.

In Example 9, the memory cell circuit of example 8 may optionally include that the second decoupling structure includes a second decoupling diode.

In Example 10, the memory cell circuit of example 9 may optionally include that a cathode of the second decoupling diode is connected to the second auxiliary terminal and an anode of the second decoupling diode is connected to the second auxiliary voltage supply terminal.

In Example 11, the memory cell circuit of example 8 may optionally include that the second decoupling structure includes a second decoupling transistor.

In Example 12, the memory cell circuit of example 11 may optionally include that a second source/drain node of the second decoupling transistor is connected to the second auxiliary terminal, a second source/drain node of the second decoupling transistor is connected to the second auxiliary voltage supply terminal, and a gate node of the second decoupling transistor is connected to an auxiliary control terminal (e.g., a second auxiliary control terminal).

In Example 13, the memory cell circuit of any one of examples 3 to 12 may optionally include that at least one of the first auxiliary voltage supply terminal and the second auxiliary voltage supply terminal is connected to a ground potential (e.g., to ground).

In Example 14, the memory cell circuit of any one of examples 1 to 13 may optionally include that the ferroelectric structure includes at least one ferroelectric layer or is a ferroelectric layer. The ferroelectric structure may be or may include one or more ferroelectric layers of any size or shape that allow for a proper functioning of the memory cell.

In Example 15, the memory cell circuit of example 14 may optionally include that the ferroelectric structure includes hafnium oxide. As an example, the hafnium oxide may be doped with silicon.

In Example 16, the memory cell circuit of any one of examples 1 to 15 may optionally include that one or more electrical properties of the ferroelectric structure the ferroelectric structure can be (e.g., permanently) influenced via providing the auxiliary voltage to the ferroelectric structure during a growth process or during an annealing process after the ferroelectric structure has been formed. The auxiliary voltage may be for bringing the ferroelectric structure into a predefined condition. As an example, the predefined condition may be a predefined crystal structure, a predefined ferroelectric domain structure, a predefined crystal size, a predefined crystal orientation, or the like.

In Example 17, the memory cell circuit of any one of examples 1 to 16 may optionally include a first contact element connected to the first control terminal and a second contact element connected to the second control terminal. Additionally or alternatively, the first contact element may be connected to the first auxiliary terminal and the second contact element may be connected to the second auxiliary terminal.

In Example 18, the memory cell circuit of example 17 may optionally include that the ferroelectric structure is arranged between the first contact element and the second contact element such that a voltage drop between the first contact element and the second contact element provides a voltage drop across the ferroelectric structure.

In Example 19, the memory cell circuit of any one of examples 1 to 18 may optionally include a control circuit connected to the first control terminal and the second control terminal, the control circuit being configured to instruct an operation of the memory cell.

In Example 20, the memory cell circuit of any one of examples 1 to 19 may optionally include that the memory cell is configured as a ferroelectric capacitor structure.

In Example 21, the memory cell circuit of example 22 may optionally that the ferroelectric capacitor structure includes a first electrode connected to the first auxiliary terminal and to the first control terminal, and a second electrode connected to the second auxiliary terminal and to the second control terminal.

In Example 22, the memory cell circuit of any one of examples 1 to 20 may optionally include that the memory cell is configured as a field-effect transistor structure.

In Example 23, the memory cell circuit of example 22 may optionally include that one of a first source/drain node or a gate node of the field-effect transistor structure is connected to the first auxiliary terminal, the other one of the first source/drain node or the gate node of the field-effect transistor structure is connected to the second auxiliary terminal, and a second source/drain node of the field-effect transistor structure is connected to an auxiliary control terminal.

In Example 24, the memory cell circuit of example 23 may optionally include that a first source/drain node of the field-effect transistor structure is connected to the first auxiliary terminal, a second source/drain node of the field-effect transistor structure is connected to the second auxiliary terminal, and a gate node of the field-effect transistor structure is connected to an auxiliary control terminal.

In Example 25, the memory cell circuit of any one of examples 22 to 24 may optionally further include a third control terminal, and that a gate node of the field-effect transistor structure is connected to the first control terminal, a first source/drain node of the field-effect transistor structure is connected to the second control terminal, and a second source/drain node of the field-effect transistor structure is connected to the third control terminal or to a reference potential (e.g., to a reference voltage).

In some aspects, the reference potential may be a ground potential (e.g., the reference voltage may be a ground voltage).

In Example 26, the memory cell circuit of any one of examples 1 to 25 may optionally include an auxiliary voltage supply circuit configured to generate the auxiliary voltage for the ferroelectric structure.

In Example 27, the memory cell circuit of example 26 may optionally include a decoupling arrangement disposed between the memory cell and the auxiliary voltage supply circuit. The decoupling arrangement may be configured to allow an operation of the memory cell via the first control terminal and the second control terminal without a substantial current flow from the memory cell to the auxiliary voltage supply circuit.

In Example 28, the memory cell circuit of example 27 may optionally include that the decoupling arrangement is configured to prevent a substantial current flow from the memory cell to the auxiliary voltage supply circuit in a first operation mode of the decoupling arrangement. The decoupling arrangement is configured to allow a substantial current flow from the auxiliary voltage supply circuit to the memory cell in a second operation mode of the decoupling arrangement.

In Example 29, the memory cell circuit of any one of examples 26 to 28 may optionally include that the auxiliary voltage supply circuit is connected to a first auxiliary voltage supply terminal and to a second auxiliary voltage supply terminal.

In Example 30, the memory cell circuit of example 29 may optionally include that the decoupling arrangement is configured to allow a substantial current flow from the auxiliary voltage supply circuit to at least one of the first auxiliary terminal and the second auxiliary terminal.

In Example 31, the memory cell circuit of example 29 or 30 may optionally include that the decoupling arrangement is configured to allow a substantial current flow from the first auxiliary voltage supply terminal to the first auxiliary terminal and/or from the second auxiliary voltage supply terminal to the second auxiliary terminal.

In Example 32, the memory cell circuit of any one of examples 29 to 31 may optionally include that the auxiliary voltage supply circuit is configured to provide a reference voltage (e.g., a reference potential) to at least one of the first auxiliary voltage supply terminal or the second auxiliary voltage supply terminal.

In some aspects, the reference voltage may be a ground voltage (e.g., the reference potential may be a ground potential).

In Example 33, the memory cell circuit of any one of examples 29 to 32 may optionally include that the decoupling arrangement is configured to forward a voltage applied at the first auxiliary voltage supply terminal and the second auxiliary voltage supply terminal to apply the voltage to the ferroelectric structure in the second operation mode of the decoupling arrangement.

In Example 34, the memory cell circuit of any one of examples 29 to 33 may optionally include that the auxiliary voltage supply circuit includes one or more power generating elements configured to receive electromagnetic radiation and to convert the received electromagnetic radiation into an electrical power (e.g., a current or a voltage).

In Example 35, the memory cell circuit of example 34 may optionally include that the one or more power generating elements include one or more photo diodes.

In some aspects, at least one photo diode of the one or more photo diodes may be a high temperature photo diode.

In Example 36, the memory cell circuit of example 35 may optionally include that the one or more photo diodes are configured to receive light and to convert the received light into an electrical current. By way of example, at least one photo diode of the one or more photo diodes is sensitive in the wavelength range from about 100 nm to about 1500 nm. As another example, at least one photo diode of the one or more photo diodes is sensitive in the wavelength range from about 500 nm to about 1000 nm.

In Example 37, the memory cell circuit of example 35 or 36 may optionally include that at least one photo diode of the one or more photo diodes is configured to operate in photovoltaic mode.

Example 38 is a memory cell arrangement including a plurality of memory cell circuits according to any one of examples 1 to 25. The memory cell arrangement may further include an auxiliary voltage supply circuit coupled to each memory cell circuit of the plurality of memory cell circuits, the auxiliary voltage supply circuit being configured to generate the respective auxiliary voltage for each memory cell circuit of the plurality of memory cell circuits.

Example 39 is a memory cell arrangement including a plurality of memory cell circuits according to any one of examples 1 to 25. The memory cell arrangement may further include an auxiliary voltage supply circuit coupled to each memory cell circuit of the plurality of memory cell circuits, the auxiliary voltage supply circuit being configured to generate the respective auxiliary voltage for each memory cell circuit of the plurality of memory cell circuits. The memory cell arrangement may further include at least one common decoupling structure arranged between the auxiliary voltage supply circuit and a common first auxiliary voltage supply terminal connected to each memory cell circuit of the plurality of memory cell circuits.

In Example 40, the memory cell arrangement according to example 39 may optionally include that the at least one common decoupling structure is configured to prevent a substantial current flow from each memory cell circuit of the plurality of memory cell circuits to the auxiliary voltage supply circuit during an operation of the respective memory cell of the memory cell circuit.

Example 41 is a memory cell circuit including: a memory cell including a ferroelectric structure; at least two control terminals connected to the memory cell, the at least two control terminals being configured to allow an operation of the memory cell; and at least one auxiliary terminal connected to the memory cell, the at least one auxiliary terminal being configured to provide an auxiliary voltage to the ferroelectric structure.

In some aspects, the memory cell circuit of example 41 may further include any of the features of the memory cell circuit of examples 2 to 37.

Example 42 is a method of fabricating a memory cell circuit. The method may include forming a ferroelectric memory cell. The method may include annealing the ferroelectric memory cell, and at least during a part of the annealing, supplying an auxiliary voltage to the ferroelectric memory cell to influence one or more electric properties of the ferroelectric memory cell.

In Example 43, the method of example 42 may optionally include that the supplied auxiliary voltage reorients electric dipoles of a ferroelectric structure of the ferroelectric memory cell.

In Example 44, the method of example 42 or 43 may optionally include that the supplied auxiliary voltage is configured to bring the ferroelectric memory cell into a predefined condition.

In Example 45, the method of example 44 may optionally include that the predefined condition of the memory cell may include a memory window of the memory cell (e.g., a width and/or a position of the memory window). In some aspects, the predefined condition of the memory cell may include a programming voltage and/or a readout voltage of the memory cell.

In Example 46, the method of example 44 or 45 may optionally include that the predefined condition of the memory cell includes a predefined coercive field of a ferroelectric structure of the memory cell and/or a predefined remanent polarization of the ferroelectric structure of the memory cell.

In Example 47, the method of any one of examples 42 to 46 may optionally include that the ferroelectric memory cell is configured as a ferroelectric capacitor structure or as a ferroelectric field-effect transistor structure.

In Example 48, the method of any one of examples 42 to 47 may optionally include that the supplied auxiliary voltage is greater than about 100 mV. By way of example, the supplied auxiliary voltage may be in the range from about 500 mV to about 20 V.

In Example 49, the method of any one of examples 42 to 48 may optionally include that supplying an auxiliary voltage to the ferroelectric memory cell includes converting electromagnetic radiation into an electrical power, and providing the electrical power to the ferroelectric memory cell. By way of example, the electromagnetic radiation may be converted into electrical power by means of one or more photo diodes.

In Example 50, the method of any one of examples 42 to 49 may optionally include that annealing the ferroelectric memory cell includes heating the ferroelectric memory cell to a temperature greater than about 200° C. By way of example, the temperature may be in the range from about 300° C. to about 1000° C.

In Example 51, the method of any one of examples 42 to 50 may optionally include that annealing the ferroelectric memory cell includes irradiating the ferroelectric memory cell with annealing radiation.

In Example 52, the method of example 51 may optionally include that supplying an auxiliary voltage to the ferroelectric memory cell includes converting at least a portion of the annealing radiation into an electrical power and providing the electrical power to the ferroelectric memory cell. By way of example, the annealing radiation may be converted into electrical power by means of one or more photo diodes.

In Example 53, the method of example 51 or 52 may optionally include that the annealing radiation includes light. By way of example light may have a wavelength in the range from about 100 nm to about 1500 nm. As another example, the light may have a wavelength in the range from about 500 nm to about 1000 nm.

Example 54 is a method of fabricating a memory cell circuit including irradiating the memory cell circuit of example 1, 26, and 27 with annealing radiation to anneal the ferroelectric structure of the memory cell of the memory cell circuit and to generate a voltage drop across the ferroelectric structure by converting at least a portion of the annealing radiation into electrical power by means of the auxiliary voltage supply circuit.

Example 55 is a method of fabricating a memory cell circuit. The method may include forming a ferroelectric structure (e.g., of a memory cell, for example a ferroelectric layer or film). The method may include annealing the ferroelectric structure; and at least during a part of the annealing, supplying an auxiliary voltage to the ferroelectric structure to influence one or more electric properties of the ferroelectric structure.

In some aspects, the method of example 55 may include any of the features of the method of examples 43 to 53.

Example 56 is a method of fabricating a memory cell circuit. The method may include forming a ferroelectric structure. The method may include annealing the ferroelectric structure, and at least during a part of the annealing, controlling an orientation of the dipoles of the ferroelectric structure (e.g., of the material of the ferroelectric structure).

In some aspects, the method of example 56 may include any of the features of the method of examples 43 to 53.

Example 57 is a method of fabricating a memory cell arrangement. The method may include forming a plurality of ferroelectric memory cells. The method may include annealing (e.g., simultaneously) the ferroelectric memory cells, and at least during a part of the annealing, supplying an auxiliary voltage to at least one (e.g., to each) ferroelectric memory cell to influence one or more electric properties of the at least one ferroelectric memory cell.

Example 58 is a method of fabricating an electronic device. The method may include forming one or more electronic devices on a substrate (e.g., on a wafer), wherein forming the one or more electronic devices includes at least one annealing process, the at least one annealing process includes irradiating the substrate with electromagnetic radiation, and at least during a part of the at least one annealing process, generating an auxiliary voltage via one or more photo diodes arranged on the substrate, and supplying the auxiliary voltage to at least one of the one or more electronic devices to influence one or more electric properties thereof.

Example 59 is a memory cell arrangement, the memory cell arrangement including: a plurality of memory cell circuits, each memory cell circuit including: a respective memory cell, the memory cell including a ferroelectric structure; a respective first control terminal and a respective second control terminal connected to the memory cell, the first control terminal and the second control terminal being configured to allow an operation of the memory cell; and a respective first auxiliary terminal and a respective second auxiliary terminal connected to the memory cell, the first auxiliary terminal and the second auxiliary terminal being configured to provide an auxiliary voltage to the ferroelectric structure.

In Example 60, the memory cell arrangement of example 59 may optionally further include at least one auxiliary voltage supply circuit coupled to each memory cell circuit of the plurality of memory cell circuits, the auxiliary voltage supply circuit being configured to generate the respective auxiliary voltage for each memory cell circuit of the plurality of memory cell circuits.

In Example 61, the memory cell arrangement of example 59 or 60 may optionally further include at least one common decoupling structure arranged between the auxiliary voltage supply circuit and a common first auxiliary voltage supply terminal connected to each memory cell circuit of the plurality of memory cell circuits.

In Example 62, the memory cell arrangement of any one of examples 59 to 61 may optionally further include a plurality of decoupling structure pairs, each decoupling structure pair being associated with a respective memory cell circuit of the plurality of memory cell circuits. A decoupling structure pair may include a first decoupling structure associated with (e.g., coupled to) one of the first auxiliary terminal or second auxiliary terminal of the respective memory cell circuit, and a second decoupling structure associated with the other one of the first auxiliary terminal or second auxiliary terminal of the respective memory cell circuit. As an example, each first decoupling structure in the plurality of decoupling structure pairs may be connected between the first auxiliary terminal and a first auxiliary voltage supply terminal of the respective memory cell circuit. Each second decoupling structure in the plurality of decoupling structure pairs may be connected between the second auxiliary terminal and a second auxiliary voltage supply terminal of the respective memory cell circuit.

In Example 63, the memory cell arrangement of any one of examples 59 to 62 may optionally further include a control circuit configured to control an operation (e.g., a write and/or read operation) of the plurality of memory cells. The memory cell arrangement may further include a plurality of control lines (e.g., word-lines and source/bit-lines) configured to deliver a respective control signal from the control circuit to a (e.g., each) memory cell circuit of the plurality memory cell circuits (e.g., to the respective first and second control terminals of the memory cell circuits). The respective control terminals of each memory cell circuit may be connected with one or more of the control lines. The respective (first and second) auxiliary terminals of each memory cell circuit are not connected to any control line. Illustratively, the auxiliary terminals of each memory cell circuit are configured (e.g., disposed in the arrangement) in such a way that they do not contribute (in other words, do not take part) to the control of the write operation and/or read operation of the memory cell circuit (illustratively, to the addressing of the memory cell circuit).

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell circuit comprising:
a memory cell, the memory cell comprising a ferroelectric structure;
a first control terminal and a second control terminal connected to the memory cell, the first control terminal and the second control terminal being configured to allow an operation of the memory cell; and
a first auxiliary terminal and a second auxiliary terminal connected to the memory cell, the first auxiliary terminal and the second auxiliary terminal being configured to provide an auxiliary voltage to the ferroelectric structure.

2. The memory cell circuit according to claim 1, further comprising a first decoupling structure connected between a first auxiliary voltage supply terminal and the first auxiliary terminal, the first decoupling structure being configured to allow an operation of the memory cell via the first control terminal and the second control terminal without a substantial current flow from the first auxiliary terminal to the first auxiliary voltage supply terminal.

3. The memory cell circuit according to claim 2, wherein the first decoupling structure comprises a first decoupling diode, and
wherein a cathode of the first decoupling diode is connected to the first auxiliary terminal and an anode of the first decoupling diode is connected to the first auxiliary voltage supply terminal.

4. The memory cell circuit according to claim 2, wherein the first decoupling structure comprises a first decoupling transistor, and
wherein a first source/drain node of the first decoupling transistor is connected to the first auxiliary terminal, a second source/drain node of the first decoupling transistor is connected to the first auxiliary voltage supply terminal, and a gate node of the first decoupling transistor is connected to an auxiliary control terminal.

5. The memory cell circuit according to claim 1, further comprising a second decoupling structure connected between a second auxiliary voltage supply terminal and the second auxiliary terminal, the second decoupling structure being configured to allow an operation of the memory cell via the first control terminal and the second control terminal without a substantial current flow from the second auxiliary terminal to the second auxiliary voltage supply terminal.

6. The memory cell circuit according to claim 5, wherein the second decoupling structure comprises a second decoupling diode, and
wherein a cathode of the second decoupling diode is connected to the second auxiliary terminal and an anode of the second decoupling diode is connected to the second auxiliary voltage supply terminal.

7. The memory cell circuit according to claim 5, wherein the second decoupling structure comprises a second decoupling transistor, and
wherein a first source/drain node of the second decoupling transistor is connected to the second auxiliary terminal, a second source/drain node of the second decoupling transistor is connected to the second auxiliary voltage supply terminal, and a gate node of the second decoupling transistor is connected to an auxiliary control terminal.

8. The memory cell circuit according to claim 1,
wherein the ferroelectric structure comprises hafnium oxide.

9. The memory cell circuit according to claim 1,
wherein the memory cell is configured as a ferroelectric capacitor structure,
wherein the ferroelectric capacitor structure comprises a first electrode connected to the first auxiliary terminal and to the first control terminal, and a second electrode connected to the second auxiliary terminal and to the second control terminal.

10. The memory cell circuit according to claim 1,
wherein the memory cell is configured as a field-effect transistor structure,
wherein one of a first source/drain node or a gate node of the field-effect transistor structure is connected to the first auxiliary terminal, the other one of the first source/drain node or the gate node of the field-effect transistor structure is connected to the second auxiliary terminal, and a second source/drain node of the field-effect transistor structure is connected to an auxiliary control terminal, or wherein a first source/drain node of the field-effect transistor structure is connected to the first auxiliary terminal, a second source/drain node of the field-effect transistor structure is connected to the second auxiliary terminal, and a gate node of the field effect transistor structure is connected to an auxiliary control terminal.

11. The memory cell circuit according to claim 1, further comprising:
an auxiliary voltage supply circuit configured to generate the auxiliary voltage for the ferroelectric structure.

12. The memory cell circuit according to claim 11, further comprising:
a decoupling arrangement disposed between the memory cell and the auxiliary voltage supply circuit,
wherein the decoupling arrangement is configured to allow an operation of the memory cell via the first control terminal and the second control terminal without a substantial current flow from the memory cell to the auxiliary voltage supply circuit.

13. The memory cell circuit according to claim 12,
wherein the decoupling arrangement is configured to prevent a substantial current flow from the memory cell to the auxiliary voltage supply circuit in a first operation mode of the decoupling arrangement, and
wherein the decoupling arrangement is configured to allow a substantial current flow from the auxiliary voltage supply circuit to the memory cell in a second operation mode of the decoupling arrangement.

14. The memory cell circuit according to claim 11,
wherein the auxiliary voltage supply circuit comprises one or more power generating elements configured to receive electromagnetic radiation and to convert the received electromagnetic radiation into an electrical power.

15. The memory cell circuit according to claim 14,
wherein the one or more power generating elements comprise one or more photo diodes.

16. A memory cell arrangement comprising:
a plurality of memory cell circuits, each memory cell circuit comprising:
a respective memory cell, the memory cell comprising a ferroelectric structure;
a respective first control terminal and a respective second control terminal connected to the memory cell, the first control terminal and the second control terminal being configured to allow an operation of the memory cell; and
a respective first auxiliary terminal and a respective second auxiliary terminal connected to the memory cell, the first auxiliary terminal and the second auxiliary terminal being configured to provide an auxiliary voltage to the ferroelectric structure.

17. The memory cell arrangement according to claim 16, further comprising:
at least one auxiliary voltage supply circuit coupled to each memory cell circuit of the plurality of memory cell circuits, the at least one auxiliary voltage supply circuit being configured to generate the respective auxiliary voltage for each memory cell circuit of the plurality of memory cell circuits.

18. The memory cell arrangement of claim 16, further comprising:
at least one common decoupling structure arranged between the auxiliary voltage supply circuit and a common first auxiliary voltage supply terminal connected to each memory cell circuit of the plurality of memory cell circuits.

19. The memory cell arrangement of claim 16, further comprising:
a control circuit configured to control a write operation and/or a read operation of the plurality of memory cell circuits;
a plurality of control lines configured to deliver a respective control signal from the control circuit to the first control terminal and the second control terminal of each memory cell circuit of the plurality of memory cell circuits;
wherein the first auxiliary terminal and the second auxiliary terminal of each memory cell circuit of the plurality of memory cell circuits are not connected to any control line, such that the first auxiliary terminal and the second auxiliary terminal of each memory cell circuit do not contribute to the control of the write operation and/or read operation of the memory cell circuit.

* * * * *